(12) United States Patent
Sakai

(10) Patent No.: US 7,262,985 B2
(45) Date of Patent: Aug. 28, 2007

(54) MEMORY

(75) Inventor: Naofumi Sakai, Kitakyusyu (JP)

(73) Assignee: Sanyo Electric Co., Ltd., Osaka (JP)

( * ) Notice: Subject to any disclaimer, the term of this patent is extended or adjusted under 35 U.S.C. 154(b) by 178 days.

(21) Appl. No.: 11/229,763

(22) Filed: Sep. 20, 2005

(65) Prior Publication Data

US 2006/0067101 A1    Mar. 30, 2006

(30) Foreign Application Priority Data

Sep. 24, 2004    (JP)    ............... 2004-276510

(51) Int. Cl.
*G11C 11/22*    (2006.01)

(52) U.S. Cl. ................. 365/145; 365/149; 365/189.01; 365/210

(58) Field of Classification Search ................ 365/145, 365/149, 189.01, 210
See application file for complete search history.

(56) References Cited

U.S. PATENT DOCUMENTS

| | | | |
|---|---|---|---|
| 6,088,257 A * | 7/2000 | Jeon et al. ................. | 365/145 |
| 6,229,728 B1 | 5/2001 | Ono et al. | |
| 6,356,475 B1 * | 3/2002 | Tamura et al. ............... | 365/145 |
| 2002/0097618 A1 * | 7/2002 | Ohno et al. ................. | 365/201 |

FOREIGN PATENT DOCUMENTS

| | | |
|---|---|---|
| JP | 2000-67597 | 3/2000 |
| JP | 2001-210795 A | 8/2001 |
| KR | 10-0326991 | 2/2002 |
| KR | 10-2004-0028738 | 4/2004 |
| WO | WO 02/086905 A2 | 10/2002 |

OTHER PUBLICATIONS

Korean Office Action issued in corresponding Korean Patent Application No. KR 10-2005-0088738, dated Nov. 20, 2006.

* cited by examiner

*Primary Examiner*—Anh Phung
*Assistant Examiner*—Toan Le
(74) *Attorney, Agent, or Firm*—McDermott Will & Emery LLP

(57) ABSTRACT

A memory capable of easily setting a reference potential and correctly determining data is provided. This memory comprises a ferroelectric capacitor holding data, and a driving line and a data line linked with the ferroelectric capacitor. The memory applies a voltage pulse to the ferroelectric capacitor through the driving line when reading the data thereby generating a negative potential on the data line if the ferroelectric capacitor holds first data, or generating a positive potential on the data line if the ferroelectric capacitor holds second data.

20 Claims, 15 Drawing Sheets

MEMORY

BACKGROUND OF THE INVENTION

1. Field of the Invention

The present invention relates to a memory, and more particularly, it relates to a memory including ferroelectric capacitors.

2. Description of the Background Art

A ferroelectric memory is generally known as one of nonvolatile memories, as disclosed in Japanese Patent Laying-Open No. 2001-210795, for example. The ferroelectric memory utilizes pseudo capacitance change depending on the direction of polarization of a ferroelectric substance as a memory device. The ferroelectric memory is spotlighted as an ideal memory allowing data rewriting at a high speed and a low voltage in principle and having nonvolatility.

FIG. 23 is a circuit diagram showing the structure of an exemplary conventional 1T1C ferroelectric memory. Referring to FIG. 23, the exemplary conventional 1T1C ferroelectric memory comprises a plurality of memory cells 101, a reference voltage generation circuit 102 and a sense amplifier 103. The plurality of memory cells 101 are provided along a bit line pair BL100/BL101 consisting of bit lines BL100 and BL101. A plurality of word lines WL100 to WL103 and a plurality of plate lines PL100 and PL101 are provided to extend perpendicularly to the bit line pair BL100/BL101. The memory cells 101 are formed by single ferroelectric capacitors CF100 to CF103 holding data and single access transistors Tr100 to Tr103 consisting of n-channel transistors respectively. The ferroelectric capacitors CF100 to CF103 are constituted of first electrodes, second electrodes and ferroelectric films held between the first and second electrodes respectively. The first electrode of the ferroelectric capacitor CF100 (CF102) is connected to the plate line PL100 (PL101), while the second electrode thereof is connected to either the source or the drain of the access transistor Tr100 (Tr102). Either the drain or the source of the access transistor Tr100 (Tr102) is connected to the bit line BL100. The gate of the access transistor Tr100 (Tr102) is connected to the word line WL100 (WL102). The first electrode of the ferroelectric capacitor CF101 (CF103) is connected to the plate line PL100 (PL101), while the second electrode thereof is connected to either the source or the drain of the access transistor Tr101 (Tr103). Either the drain or the source of the access transistor Tr101 (Tr103) is connected to the bit line BL101. The gate of the access transistor Tr101 (Tr103) is connected to the word line WL101 (WL103).

The reference voltage generation circuit 102 is provided every bit line pair BL100/BL101. This reference voltage generation circuit 102 is so provided as to supply a reference potential $V_{ref}$ serving as a reference voltage for data determination to the sense amplifier 103 through the bit line BL100 or BL101. The reference voltage generation circuit 102 is formed by three n-channel transistors 104 to 106 and one capacitor 107. Either the source or the drain of the n-channel transistor 104 is connected to either the source or the drain of the n-channel transistor 105. Either the drain or the source of the n-channel transistor 104 is connected to the bit line BL100, while either the drain or the source of the n-channel transistor 105 is connected to the bit line BL101. Control signals DMP0 and DMPE for ON-OFF controlling the n-channel transistors 104 and 105 are input in the gates of the n-channel transistors 104 and 105 respectively. Either the source or the drain of the n-channel transistor 106 is connected to a node ND101 between either the source or the drain of the n-channel transistor 104 and either the source or the drain of the n-channel transistor 105. Either the drain or the source of the n-channel transistor 106 is supplied with the reference potential $V_{ref}$. This reference potential $V_{ref}$ is generated by a reference potential generation circuit (not shown). A control signal DMPRS for ON-OFF controlling the n-channel transistor 106 is input in the gate of the n-channel transistor 106. A first electrode of the capacitor 107 is connected to a node ND102 between either the source or the drain of the n-channel transistor 104 and either the source or the drain of the n-channel transistor 105. A second electrode of the capacitor 107 is grounded.

The sense amplifier 103 is also provided every bit line pair BL100/BL101. This sense amplifier 103 is connected to the bit lines BL100 and BL101. A sense amplifier activation signal SAE is input in the sense amplifier 103 for activating the same. The sense amplifier 103 has a function of amplifying potential difference between the bit lines BL100 and BL101 by comparing a potential, corresponding to any of the data held in the ferroelectric capacitors CF100 to CF103, generated on either the bit line BL100 or the bit line BL101 with the reference potential $V_{ref}$ and determining the difference therebetween when the memory reads the data from the corresponding one of the ferroelectric capacitors CF100 to CF103. More specifically, the sense amplifier 103 is so formed as to set the potential generated on either the bit line BL100 or the bit line BL101 to the GND level when the potential, corresponding to any of the data held in the ferroelectric capacitors CF100 to CF103, generated on either the bit line BL100 or the bit line BL101 is lower than the reference potential $V_{ref}$ supplied from the reference voltage generation circuit 102 through either the bit line BL101 or the bit line BL100 in data reading. The sense amplifier 103 is also so formed as to amplify the potential generated on either the bit line BL100 or the BL101 to a level Vcc when the potential, corresponding to any of the data held in the ferroelectric capacitors CF100 to CF103, generated on either the bit line BL100 or the bit line BL101 is higher than the reference potential $V_{ref}$ supplied from the reference voltage generation circuit 102 through either the bit line BL101 or the bit line BL100 in data reading.

FIG. 24 is a voltage waveform diagram for illustrating operations of the exemplary conventional 1T1C ferroelectric memory. FIG. 25 is a hysteresis diagram showing a polarization state of the ferroelectric capacitor CF100 of the exemplary conventional 1T1C ferroelectric memory. The operations of the exemplary conventional 1T1C ferroelectric memory are now described with reference to FIGS. 23 to 25.

In an initial state of data reading, the potentials of the word line WL100, the plate line PL100 and the bit line BL100 are held at the GND level, as shown in FIG. 24. The potentials of the control signals DMPRS, DMP0 and DMPE and the sense amplifier activation signal SAE are also held at the GND level. In this state, the word line WL100 rises from the GND level to the potential Vcc. Thus, the access transistor Tr100 linked with the word line WL100 enters an ON-state. Further, the control signal DMPRS also rises from the GND level to the potential Vcc. Thus, the n-channel transistor 106 of the reference voltage generation circuit 102 also enters an ON-state. Therefore, the reference potential $V_{ref}$ is supplied through the ON-state n-channel transistor 106 for setting the nodes ND101 and ND102 to the reference potential $V_{ref}$ while charging the capacitor 107 with the reference potential $V_{ref}$.

Then, the plate line PL100 rises from the GND level to the potential Vcc. Thus, the voltage Vcc is applied to the ferroelectric capacitor CF100 through the plate line PL100.

Therefore, a read potential responsive to the data held in the ferroelectric capacitor CF100 is generated on the bit line BL100. If the ferroelectric capacitor CF100 holds data "0" at this time, the polarization state of the ferroelectric capacitor CF100 shifts from "0" to a point A along a hysteresis curve as shown in FIG. 25. Thus, the total charge quantity of the bit line BL100 linked with the ferroelectric capacitor CF100 is increased by a charge quantity $Q_{0up}$ shown in FIG. 25. Therefore, the potential of the bit line BL100 is increased in correspondence to the charge quantity $Q_{0up}$. If the ferroelectric capacitor CF100 holds data "1", on the other hand, the polarization state of the ferroelectric capacitor CF100 shifts from "1" to the point A along the hysteresis curve. Thus, the total charge quantity of the bit line BL100 linked with the ferroelectric capacitor CF100 is increased by a charge quantity $Q_{1up}$ shown in FIG. 25. Therefore, the potential of the bit line BL100 is increased in correspondence to the charge quantity $Q_{1up}$. The increment $Q_{1up}$ of the total charge quantity of the bit line BL100 linked with the ferroelectric capacitor CF100 holding the data "1" is larger than the increment $Q_{0up}$ of the total charge quantity of the bit line BL100 linked with the ferroelectric capacitor CF100 holding the data "0", as understood from the hysteresis diagram in FIG. 25. Thus, the potential of the bit line BL100 linked with the ferroelectric capacitor CF100 holding the data "1" is higher than the potential of the bit line BL100 linked with the ferroelectric capacitor CF100 holding the data "0".

Then, the control signal DMPE rises from the GND level to the potential Vcc. Thus, the n-channel transistor 105 of the reference voltage generation circuit 102 enters an ON-state. Therefore, the reference potential $V_{ref}$ charged in the capacitor 107 is supplied to the bit line BL101 through the ON-state n-channel transistor 105. Thus, the potential of the bit line BL101 is held at the reference potential $V_{ref}$. Then, the control signal DMPRS falls from the potential Vcc to the GND level. Thus, the n-channel transistor 106 of the reference voltage generation circuit 102 enters an OFF-state. Then, the control signal DMPE also falls from the potential Vcc to the GND level. Thus, the n-channel transistor 105 of the reference voltage generation circuit 102 enters an OFF-state. Therefore, the bit line BL101 enters a floating state (high-impedance state) while holding the reference potential $V_{ref}$.

In this state, the sense amplifier activation signal SAE rises from the GND level to the potential Vcc, thereby activating the sense amplifier 103. Thus, the sense amplifier 103 determines and amplifies the data read from the ferroelectric capacitor CF100 by comparing the potential of the bit line BL100 corresponding to the read data and the reference potential $V_{ref}$ of the bit line BL101 with each other. In other words, the sense amplifier 103 determines the data read from the ferroelectric capacitor CF100 as "0" and sets the potential of the bit line BL100 to the GND level when the potential of the bit line is lower than the potential (reference potential $V_{ref}$) of the bit line BL101. When the potential of the bit line BL100 is higher than the potential (reference potential $V_{ref}$) of the bit line BL101, on the other hand, the sense amplifier 103 determines the data read from the ferroelectric capacitor CF100 as "1" and amplifies the potential of the bit line BL100 to the level Vcc. The potential of the bit line BL100 set to the GND level or the level Vcc by the sense amplifier 103 is output from the 1T1C ferroelectric memory.

In the exemplary conventional 1T1C ferroelectric memory shown in FIG. 23, the hysteresis of the ferroelectric capacitor CF100 may be dispersed due to dispersion of conditions for forming the ferroelectric film constituting the ferroelectric capacitor CF100. In this case, the potential ("0" potential) of the bit line BL100 linked with the ferroelectric capacitor CF100 from which the data "0" is read and the potential ("1" potential) of the bit line BL100 linked with the ferroelectric capacitor CF100 from which the data "1" is read are distributed as shown in FIG. 26 respectively. Depending on the hysteresis of the ferroelectric capacitor CF, further, the distribution range of the "0" potential may exceed that of the "1" potential as shown in FIG. 27, or the distribution range of the "1" potential may exceed that of the "0" potential as shown in FIG. 28. When the distribution ranges of the "0" and "1" potentials are dispersed as shown in FIGS. 26 to 28, it is disadvantageously difficult to set the reference potential $V_{ref}$ employed for determining the data "0" or "1". Further, the distribution ranges of the "0" and "1" potentials may overlap with each other as shown in FIG. 29, depending on the hysteresis of the ferroelectric capacitor CF100. In this case, it is disadvantageously difficult to correctly determine the data, regardless of the level of the reference potential $V_{ref}$.

SUMMARY OF THE INVENTION

The present invention has been proposed in order to solve the aforementioned problems, and an object of the present invention is to provide a memory capable of easily setting a reference potential and correctly determining data.

In order to attain the aforementioned object, a memory according to a first aspect of the present invention comprises a ferroelectric capacitor holding data and a driving line and a data line linked with the ferroelectric capacitor. The memory applies a voltage pulse to the ferroelectric capacitor through the driving line when reading the data thereby generating a negative potential on the data line if the ferroelectric capacitor holds first data, or generating a positive potential on the data line if the ferroelectric capacitor holds second data.

The memory according to the first aspect, so formed as to generate the negative potential on the data line if the ferroelectric capacitor holds the first data or to generate the positive potential on the data line if the ferroelectric capacitor holds the second data as hereinabove described, can set the reference potential for determining the first or second data to the GND level. Thus, the memory can easily set the reference potential also when the potential generated on the data line in data reading is dispersed. In the memory so formed as to generate the negative potential on the data line if the ferroelectric capacitor holds the first data or to generate the positive potential on the data line if the ferroelectric capacitor holds the second data, distribution ranges of the potential generated on the data line in data reading do not overlap with each other, whereby the memory can correctly determine the data held in the ferroelectric capacitor as the first or second data by setting the reference potential to the ground potential (GND level). The reference potential for determining the first or second data can be so set to the ground potential that the memory can employ the generally employed ground potential as the reference potential. Thus, no circuit may be separately provided for generating the reference potential dissimilarly to a case of setting the reference potential to a level other than the ground potential, whereby the circuit structure of the memory can be simplified.

The aforementioned memory according to the first aspect preferably determines the data held in the ferroelectric capacitor by comparing the potential of the data line and a reference potential of the ground level with each other when reading the data. According to this structure, the memory can easily determine the data held in the ferroelectric capacitor as the first or second data by comparing the positive or negative potential of the data line with the reference potential of the GND level.

The aforementioned memory according to the first aspect preferably determines the data held in the ferroelectric capacitor after the voltage pulse applied to the ferroelectric capacitor falls. According to this structure, the memory can determine the data after generating the negative potential on the data line if the ferroelectric capacitor holds the first data, or after generating the positive potential on the data line if the ferroelectric capacitor holds the second data, whereby the data held in the ferroelectric capacitor can be reliably determined as the first or second data.

The aforementioned memory according to the first aspect preferably reduces the total charge quantity of the data line to generate the negative potential on the data line if the ferroelectric capacitor holds the first data while increasing the total charge quantity of the data line to generate the positive potential on the data line if the ferroelectric capacitor holds the second data when reading the data. According to this structure, the memory can easily generate the negative potential on the data line if the ferroelectric capacitor holds the first data while easily generating the positive potential on the data line if the ferroelectric capacitor holds the second data in data reading.

In this case, the potential of the driving line is preferably at the ground level before the voltage pulse is applied to the ferroelectric capacitor through the driving line, and the potential of the driving line is preferably at a negative level after the voltage pulse is applied to the ferroelectric capacitor through the driving line. According to this structure, the memory can reduce an increment of the total charge quantity of the data line resulting when the voltage pulse rises from the ground potential beyond a decrement of the total charge quantity of the data line resulting when the voltage pulse falls to a negative potential if the ferroelectric capacitor holds the first data while increasing the increment of the total charge quantity of the data line resulting when the voltage pulse rises from the ground potential beyond the decrement of the total charge quantity of the data line resulting when the voltage pulse falls to the negative potential if the ferroelectric capacitor holds the second data, in response to the shape of a hysteresis curve of the ferroelectric capacitor. Thus, the memory can easily reduce the total charge quantity of the data line if the ferroelectric capacitor holds the firs data while easily increasing the total charge quantity of the data line if the ferroelectric capacitor holds the second data by applying the voltage pulse to the ferroelectric capacitor.

The aforementioned memory according to the first aspect preferably sets the data line to the negative potential before applying the voltage pulse to the ferroelectric capacitor through the driving line for reading the data, and preferably holds the data line at the negative potential by leaving the total charge quantity of the data line intact before and after applying the voltage pulse to the ferroelectric capacitor if the ferroelectric capacitor holds the first data while generating the positive potential on the data line by increasing the total charge quantity of the data line if the ferroelectric capacitor holds the second data. According to this structure, the memory can easily generate the negative potential on the data line if the ferroelectric capacitor holds the first data while easily generating the positive potential on the data line if the ferroelectric capacitor holds the second data in data reading.

In this case, the memory preferably sets the driving line to a prescribed positive potential while holding the data line at the ground potential, thereafter brings the data line into a floating state and thereafter reduces the potential of the driving line from the prescribed positive potential to the ground potential thereby setting the data line to the negative potential before applying the voltage pulse to the ferroelectric capacitor through the driving line. According to this structure, the memory, capable of reducing the potential of the data line from the ground level to a prescribed negative level following reduction of the potential of the driving line from the prescribed positive level to the ground level, can easily set the data line to the negative potential before applying the voltage pulse to the ferroelectric capacitor through the driving line in data reading.

In the aforementioned structure setting the data line to the negative potential before applying the voltage pulse to the ferroelectric capacitor through the driving line, the memory preferably further comprises a dummy driving line and a dummy ferroelectric capacitor linked with the dummy driving line and the data line, for setting the dummy driving line to a prescribed positive potential while holding the data line at the ground potential, thereafter bringing the data line into a floating state, and thereafter reducing the potential of the dummy driving line from the prescribed positive level to the ground level thereby setting the data line to the negative potential before applying the voltage pulse to the ferroelectric capacitor through the driving line. According to this structure, the memory can easily reduce the potential of the data line from the ground level to a prescribed negative level through the dummy driving line and the dummy ferroelectric capacitor following reduction of the potential of the dummy driving line from the prescribed positive level to the ground level. Thus, the memory can reduce the potential of the data line from the ground level to the prescribed negative level without applying a prescribed positive voltage to the ferroelectric capacitor holding the data, dissimilarly to a case of reducing the potential of the data line from the ground level to the prescribed negative level through the driving line and the ferroelectric capacitor. Therefore, the memory can set the potential of the data line to the negative level while inhibiting the ferroelectric capacitor holding the data from disturbance resulting from a prescribed positive voltage before applying the voltage pulse to the ferroelectric capacitor through the driving line in data reading.

A memory according to a second aspect of the present invention comprises a plurality of word lines and a plurality of bit lines arranged to intersect with each other and a memory cell, arranged on each of the intersections between the plurality of word lines and the plurality of bit lines, including a ferroelectric capacitor connected to the corresponding word line and the corresponding the bit line for holding data. The memory applies a voltage pulse to the ferroelectric capacitor through the corresponding word line when reading the data thereby generating a negative potential on the corresponding bit line if the ferroelectric capacitor holds first data, or generating a positive potential on the corresponding bit line if the ferroelectric capacitor holds second data.

The memory according to the second aspect, i.e., a cross-point ferroelectric memory comprising the memory cell including the ferroelectric capacitor arranged on each of the intersections between the plurality of word lines and the plurality of bit lines is so formed as to generate the negative potential on the corresponding bit line if the ferroelectric capacitor holds the first data or to generate the positive potential on the corresponding bit line if the ferroelectric capacitor holds the second data as hereinabove described, whereby the memory can set the reference potential for determining the first or second data to the GND level. Thus, the cross-point ferroelectric memory can easily set the reference potential also when the potential generated on the corresponding bit line in data reading is dispersed. In the memory so formed as to generate the negative potential on the corresponding bit line if the ferroelectric capacitor holds the first data or to generate the positive potential on the corresponding bit line if the ferroelectric capacitor holds the second data, distribution ranges of the potential generated on the corresponding bit line in data reading do not overlap with each other, whereby the memory can correctly determine the data held in the ferroelectric capacitor as the first or second data by setting the reference potential to the ground potential (GND level). The reference potential for determining the first or second data can be so set to the ground potential that the memory can employ the generally employed ground potential as the reference potential. Thus, no circuit may be separately provided for generating the reference potential dissimilarly to a case of setting the reference potential to a level other than the GND level, whereby the circuit structure of the cross-point ferroelectric memory can be simplified.

The aforementioned memory according to the second aspect preferably determines the data held in the ferroelectric capacitor by comparing the potential of the corresponding bit line and a reference potential of the ground level with each other when reading the data. According to this structure, the memory can easily determine the data held in the ferroelectric capacitor as the first or second data by comparing the positive or negative potential of the corresponding bit line with the reference potential of the ground level.

The aforementioned memory according to the second aspect preferably determines the data held in the ferroelectric capacitor after the voltage pulse applied to the ferroelectric capacitor falls. According to this structure, the memory, capable of determining the data after generating the negative potential on the corresponding bit line through the voltage pulse if the ferroelectric capacitor holds the first data while generating the positive potential on the corresponding bit line through the voltage pulse if the ferroelectric capacitor holds the second data, can reliably determine the data held in the ferroelectric capacitor as the first or second data.

The aforementioned memory according to the second aspect preferably reduces the total charge quantity of the corresponding bit line to generate the negative potential on the corresponding bit line if the ferroelectric capacitor holds the first data while increasing the total charge quantity of the corresponding bit line to generate the positive potential on the corresponding bit line if the ferroelectric capacitor holds the second data when reading the data. According to this structure, the memory can easily generate the negative potential on the corresponding bit line if the ferroelectric capacitor holds the first data while generating the positive potential on the corresponding bit line if the ferroelectric capacitor holds the second data in data reading.

The aforementioned memory according to the second aspect preferably sets the corresponding bit line to the negative potential before applying the voltage pulse to the ferroelectric capacitor through the corresponding word line for reading the data, and preferably holds the corresponding bit line at the negative potential by leaving the total charge quantity of the corresponding bit line intact before and after applying the voltage pulse to the ferroelectric capacitor if the ferroelectric capacitor holds the first data while generating the positive potential on the corresponding bit line by increasing the total charge quantity of the corresponding bit line if the ferroelectric capacitor holds the second data. According to this structure, the memory can easily generate the negative potential on the corresponding bit line if the ferroelectric capacitor holds the first data while generating the positive potential on the corresponding bit line if the ferroelectric capacitor holds the second data in data reading.

In this case, the memory preferably further comprises a dummy word line and a dummy ferroelectric capacitor linked with the dummy word line and the corresponding bit line, for setting the dummy word line to a prescribed positive potential while holding the corresponding bit line at the ground potential, thereafter bringing the corresponding bit line into a floating state, and thereafter reducing the potential of the dummy word line from the prescribed positive level to the ground level thereby setting the corresponding bit line to the negative potential before applying the voltage pulse to the ferroelectric capacitor through the corresponding word line. According to this structure, the memory can reduce the potential of the corresponding bit line from the ground level to a prescribed negative level through the dummy word line and the dummy ferroelectric capacitor following reduction of the potential of the dummy word line from the prescribed positive level to the ground potential. Thus, the memory can reduce the potential of the corresponding bit line from the ground level to the prescribed negative level without applying a prescribed positive voltage to the ferroelectric capacitor holding the data, dissimilarly to a case of reducing the potential of the corresponding bit line from the ground level to the prescribed negative level through the word line and the ferroelectric capacitor. Therefore, the memory can set the bit line to the negative potential while inhibiting the ferroelectric capacitor holding the data from disturbance resulting from a prescribed positive voltage before applying the voltage pulse to the ferroelectric capacitor through the corresponding word line in data reading.

A memory according to a third aspect of the present invention comprises a plurality of bit lines, a plurality of word lines and a plurality of driving lines arranged to intersect with the plurality of bit lines and a memory cell, arranged on each of the intersections between the plurality of word lines and the plurality of bit lines. The memory cell includes a transistor having either a source or a drain connected to the corresponding bit line and a gate connected to the corresponding word line and a ferroelectric capacitor connected to either the drain or the source of the transistor and the corresponding driving line for holding data. The memory applies a voltage pulse to the ferroelectric capacitor through the corresponding driving line when reading the data thereby generating a negative potential on the corresponding bit line if the ferroelectric capacitor holds first data, or generating a positive potential on the corresponding bit line if the ferroelectric capacitor holds second data.

The memory according to the third aspect, i.e., a 1T1C ferroelectric memory comprising the memory cells each provided with the transistor and the ferroelectric capacitor connected between the corresponding bit line and the corresponding driving line is so formed as to generate the negative potential on the corresponding bit line if the ferroelectric capacitor holds the first data or to generate the positive potential on the corresponding bit line if the ferroelectric capacitor holds the second data as hereinabove described, whereby the memory can set the reference potential for determining the first or second data to the GND level. Thus, the 1T1C ferroelectric memory can easily set the reference potential also when the potential generated on the corresponding bit line in data reading is dispersed. In the memory so formed as to generate the negative potential on the corresponding bit line if the ferroelectric capacitor holds the first data or to generate the positive potential on the corresponding bit line if the ferroelectric capacitor holds the second data, distribution ranges of the potential generated on the corresponding bit line in data reading do not overlap with each other, whereby the memory can correctly determine the data held in the ferroelectric capacitor as the first or second data by setting the reference potential to the ground potential (GND level). The reference potential for determining the first or second data can be so set to the ground level that the memory can employ the generally employed ground potential as the reference potential. Thus, no circuit may be separately provided for generating the reference potential dissimilarly to a case of setting the reference potential to a level other than the GND level, whereby the circuit structure of the 1T1C ferroelectric memory can be simplified.

The aforementioned memory according to the third aspect preferably determines the data held in the ferroelectric capacitor by comparing the potential of the corresponding bit line and a reference potential of the ground level with each other when reading the data. According to this structure, the memory can easily determine the data held in the ferroelectric capacitor as the first or second data by comparing the positive or negative potential of the corresponding bit line with the reference potential of the GND level.

The aforementioned memory according to the third aspect preferably determines the data held in the ferroelectric capacitor after the voltage pulse applied to the ferroelectric capacitor falls. According to this structure, the memory, capable of determining the data after generating the negative potential on the corresponding bit line through the voltage pulse if the ferroelectric capacitor holds the first data while generating the positive potential on the corresponding bit line through the voltage pulse if the ferroelectric capacitor holds the second data, can reliably determine the data held in the ferroelectric capacitor as the first or second data.

The aforementioned memory according to the third aspect preferably reduces the total charge quantity of the corresponding bit line to generate the negative potential on the corresponding bit line if the ferroelectric capacitor holds the first data while increasing the total charge quantity of the corresponding bit line to generate the positive potential on the corresponding bit line if the ferroelectric capacitor holds the second data when reading the data. According to this structure, the memory can easily generate the negative potential on the corresponding bit line if the ferroelectric capacitor holds the first data while generating the positive potential on the bit line if the ferroelectric capacitor holds the second data in data reading.

The aforementioned memory according to the third aspect preferably sets the corresponding bit line to the negative potential before applying the voltage pulse to the ferroelectric capacitor through the corresponding driving line for reading the data, and preferably holds the corresponding bit line at the negative potential by leaving the total charge quantity of the corresponding bit line intact before and after applying the voltage pulse to the ferroelectric capacitor if the ferroelectric capacitor holds the first data while generating the positive potential on the corresponding bit line by increasing the total charge quantity of the corresponding bit line if the ferroelectric capacitor holds the second data. According to this structure, the memory can easily generate the negative potential on the corresponding bit line if the ferroelectric capacitor holds the first data while generating the positive potential on the bit line if the ferroelectric capacitor holds the second data in data reading.

In this case, the memory preferably further comprises a dummy driving line and a dummy ferroelectric capacitor linked with the dummy driving line and the corresponding bit line, for setting the dummy driving line to a prescribed positive potential while holding the corresponding bit line at the ground potential, thereafter bringing the corresponding bit line into a floating state, and thereafter reducing the potential of the dummy driving line from the prescribed positive level to the ground level thereby setting the corresponding bit line to the negative potential before applying the voltage pulse to the ferroelectric capacitor through the corresponding driving line. According to this structure, the memory can reduce the potential of the corresponding bit line from the ground level to a prescribed negative level through the dummy driving line and the dummy ferroelectric capacitor following reduction of the potential of the dummy driving line from the prescribed positive level to the ground level. Thus, the memory can reduce the potential of the corresponding bit line from the ground level to the prescribed negative level without applying a prescribed positive voltage to the ferroelectric capacitor holding the data, dissimilarly to a case of reducing the potential of the corresponding bit line from the ground level to the prescribed negative level through the driving line and the ferroelectric capacitor. Therefore, the memory can set the bit line to the negative potential while inhibiting the ferroelectric capacitor holding the data from disturbance resulting from a prescribed positive voltage before applying the voltage pulse to the ferroelectric capacitor through the corresponding driving line in data reading.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention are now described with reference to the drawings.

First Embodiment

The structure of a 1T1C ferroelectric memory according to a first embodiment of the present invention is described with reference to FIG. 1.

Figure 1:
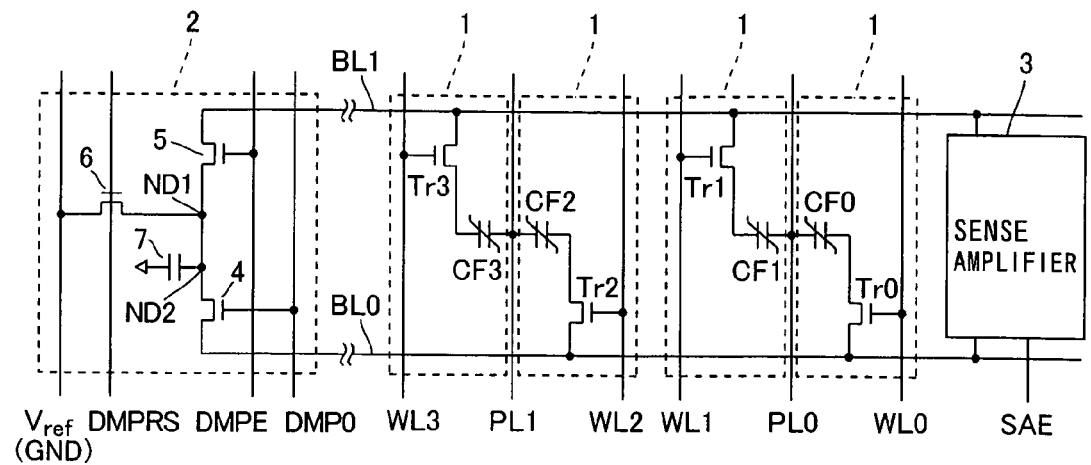
FIG. 1 is a circuit diagram showing the circuit structure of a 1T1C ferroelectric memory according to a first embodiment of the present invention.

As shown in FIG. 1, the 1T1C ferroelectric memory according to the first embodiment comprises a plurality of memory cells 1, a reference voltage generation circuit 2 and a sense amplifier 3. The plurality of memory cells 1 are provided along a bit line pair BL0/BL1 consisting of bit lines BL0 and BL1. The bit lines BL0 and BL1 are examples of the "data line" in the present invention. A plurality of word lines WL0 to WL3 and a plurality of plate lines PL0 and PL1 are provided to extend perpendicularly to the bit line pair BL0/BL1. The plate lines PL0 and PL1 are examples of the "driving line" in the present invention. The memory cells 1 are formed by single ferroelectric capacitors CF0 to CF3 holding data and single access transistors Tr0 to Tr3 consisting of n-channel transistors respectively. The ferroelectric capacitors CF0 to CF3 are constituted of first electrodes, second electrodes and ferroelectric films held between the first and second electrodes respectively. The first electrode of the ferroelectric capacitor CF0 (CF2) is connected to the plate line PL0 (PL1), while the second electrode thereof is connected to either the source or the drain of the access transistor Tr0 (Tr2). Either the drain or the source of the access transistor Tr0 (Tr2) is connected to the bit line BL0. The gate of the access transistor Tr0 (Tr2) is connected to the word line WL0 (WL2). The first electrode of the ferroelectric capacitor CF1 (CF3) is connected to the plate line PL0 (PL1), while the second electrode thereof is connected to either the source or the drain of the access transistor Tr1 (Tr3). Either the drain or the source of the access transistor Tr1 (Tr3) is connected to the bit line BL1. The gate of the access transistor Tr1 (Tr3) is connected to the word line WL1 (WL3).

The reference voltage generation circuit 2 is provided every bit line pair BL0/BL1. This reference voltage generation circuit 2 is so provided as to supply a reference potential $V_{ref}$ of the GND level (ground potential) serving as a reference voltage for data determination to the sense amplifier 3 through the bit line BL0 or BL1. The reference voltage generation circuit 2 is formed by three n-channel transistors 4 to 6 and one capacitor 7. Either the source or the drain of the n-channel transistor 4 is connected with either the source or the drain of the n-channel transistor 5. Either the drain or the source of the n-channel transistor 4 is connected to the bit line BL0, while either the drain or the source of the n-channel transistor 5 is connected to the bit line BL1. Control signals DMP0 and DMPE are input in the gates of the n-channel transistors 4 and 5, for ON-OFF controlling the n-channel transistors 4 and 5 respectively. Either the source or the drain of the n-channel transistor 6 is connected to a node ND1 between either the source or the drain of the n-channel transistor 4 and either the source or the drain of the n-channel transistor 5. Either the drain or the source of the n-channel transistor 6 is supplied with the reference potential $V_{ref}$ of the GND level (ground potential). A control signal DMPRS is input in the gate of the n-channel transistor 6 for ON-OFF controlling the n-channel transistor 6. A first electrode of the capacitor 7 is connected to a node ND2 between either the source or the drain of the n-channel transistor 4 and either the source or the drain of the n-channel transistor 5. A second electrode of the capacitor 7 is grounded.

The sense amplifier 3 is also provided every bit line pair BL0/BL1. This sense amplifier 3 is connected to the bit lines BL0 and BL1. A sense amplifier activation signal SAE is input in the sense amplifier 3 for activating the same. The sense amplifier 3 has a function of amplifying potential difference between the bit lines B0 and B1 by comparing a potential, corresponding to any of the data held in the ferroelectric capacitors CF0 to CF3, generated on either the bit line BL0 or the bit line BL1 with the reference potential $V_{ref}$ and determining the difference therebetween when the memory reads the data from the corresponding one of the ferroelectric capacitors CF0 to CF3. More specifically, the sense amplifier 3 is so formed as to set the potential generated on either the bit line BL0 or the bit line BL1 to the GND level when the potential, corresponding to any of the data held in the ferroelectric capacitors CF0 to CF3, generated on either the bit line BL0 or the bit line BL1 is lower than the reference potential $V_{ref}$ of the GND level supplied from the reference voltage generation circuit 2 through either the bit line BL1 or the bit line BL0 in data reading. The sense amplifier 3 is also so formed as to amplify the potential generated on either the bit line BL0 or the bit line BL1 to a level Vcc when the potential, corresponding to any of the data held in the ferroelectric capacitors CF0 to CF3, generated on either the bit line BL0 or the bit line BL1 is higher than the reference potential $V_{ref}$ of the GND level supplied from the reference voltage generation circuit 2 through either the bit line BL1 or the bit line BL0 in data reading.

Operations of the ferroelectric memory according to the first embodiment of the present invention are now described with reference to FIGS. 1 to 5.

Figure 2:
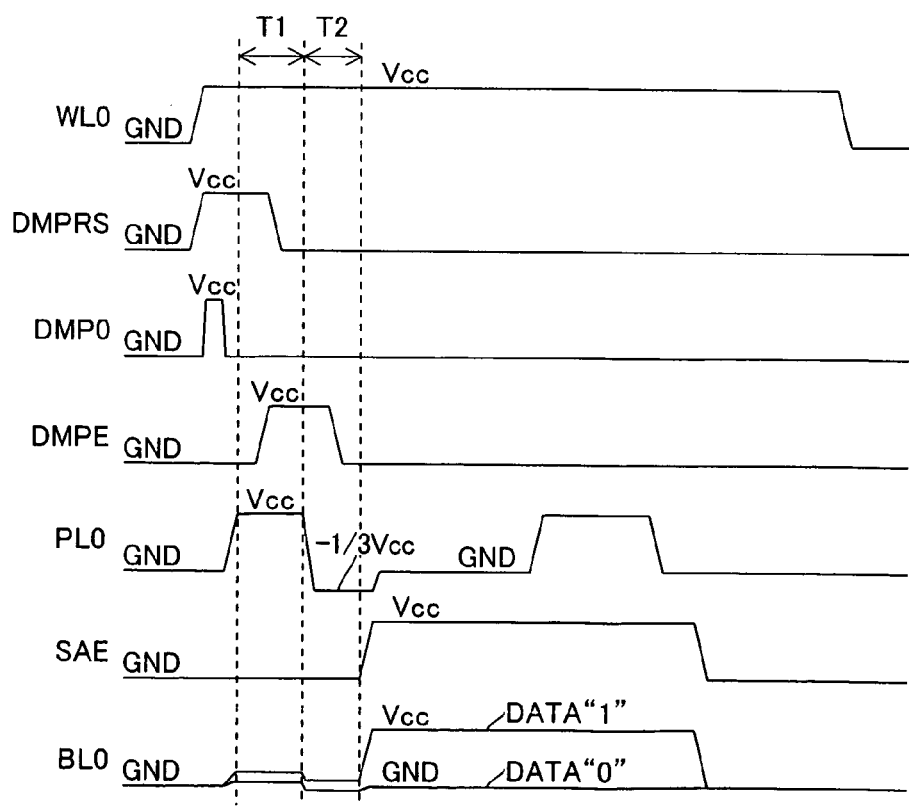
FIG. 2 is a voltage waveform diagram for illustrating operations of the 1T1C ferroelectric memory according to the first embodiment of the present invention.

In an initial state of data reading, the potentials of the word line WL0, the plate line PL0 and the bit line BL0 are held at the GND level (ground potential), as shown in FIG. 2. The potentials of the control signals DMPRS, DMP0 and DMPE and the sense amplifier activation signal SAE are also held at the GND level. In this state, the word line WL0 rises from the GND level to the potential Vcc. Thus, the access transistor Tr0 linked with the word line WL0 enters an ON-state. Further, the control signal DMPRS also rises from the GND level to the potential Vcc. Thus, the n-channel transistor 6 of the reference voltage generation circuit 2 enters an ON-state. Therefore, the reference potential $V_{ref}$ of the GND level (ground potential) is supplied through the ON-state n-channel transistor 6 for setting the potentials of the nodes ND1 and ND2 to the GND level while charging the capacitor 107 with the reference potential $V_{ref}$. Then, the control signal DMP0 rises from the GND level to the potential Vcc. Thus, the n-channel transistor 4 of the reference voltage generation circuit 2 enters an ON-state. Therefore, the reference potential $V_{ref}$ of the GND level is supplied to the bit line BL0 through the ON-state n-channel transistor 4. Thereafter the control signal DMP0 falls from the potential Vcc to the GND level. Thus, the n-channel transistor 4 of the reference voltage generation circuit 2 enters an OFF-state. Therefore, the bit line BL0 enters a floating state (high-impedance state) while holding the reference potential $V_{ref}$ of the GND level.

Figure 3:
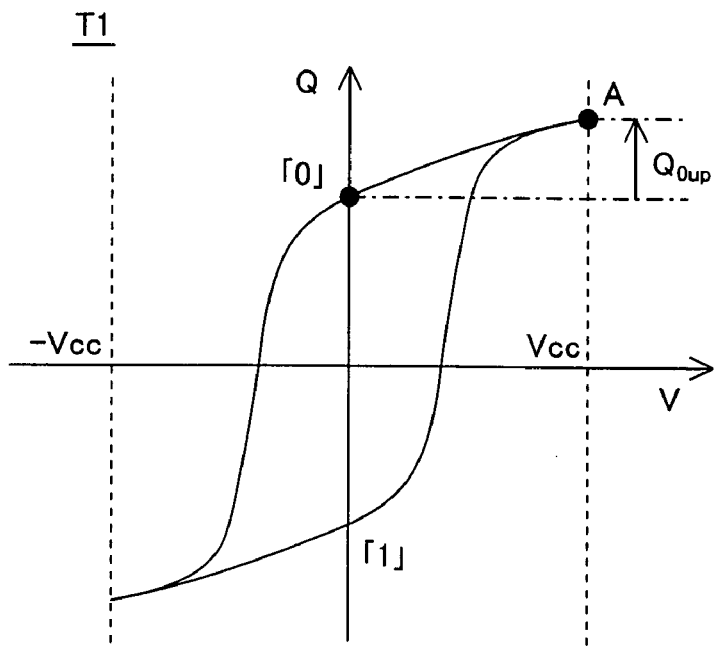
FIGS. 3 to 5 are hysteresis diagrams showing polarization states of a ferroelectric capacitor of the 1T1C ferroelectric memory according to the first embodiment of the present invention.
Figure 4:
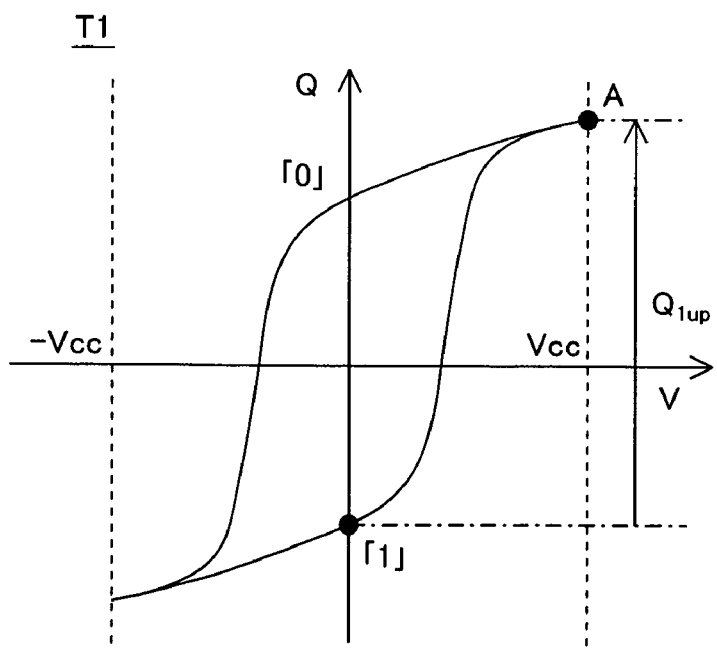

In a period T1 shown in FIG. 2, a voltage pulse is applied to the ferroelectric capacitor CF0 through the plate line PL0 for stepping up the same to the potential Vcc. More specifically, the plate line PL0 rises from the GND level to the potential Vcc. Thus, the voltage Vcc is applied to the ferroelectric capacitor CF0 through the plate line PL0. Therefore, a potential responsive to the data held in the ferroelectric capacitor CF0 is generated on the bit line BL0. If the ferroelectric capacitor CF0 holds data "0", the polarization state of the ferroelectric capacitor CF0 shifts from "0" to a point A along a hysteresis curve as shown in FIG. 3. Thus, the total charge quantity of the bit line BL0 linked with the ferroelectric capacitor CF0 is increased by a charge quantity $Q_{0up}$ shown in FIG. 3. Therefore, the potential of the bit line BL0 is increased in correspondence to the charge quantity $Q_{0up}$. If the ferroelectric capacitor CF0 holds data "1", on the other hand, the polarization state of the ferroelectric capacitor CF0 shifts from "1" to the point A along the hysteresis curve as shown in FIG. 4. Thus, the total charge quantity of the bit line BL0 linked with the ferroelectric capacitor CF0 is increased by a charge quantity $Q_{1up}$ shown in FIG. 4. Therefore, the potential of the bit line BL0 is increased in correspondence to the charge quantity $Q_{1up}$. Then, the control signal DMPE rises from the GND level to the potential Vcc. Thus, the n-channel transistor 5 of the reference voltage generation circuit 2 enters an ON-state. Therefore, the reference potential $V_{ref}$ of the GND level (ground potential) charged in the capacitor 7 is supplied to the bit line BL1 through the ON-state n-channel transistor 5. Thus, the bit line BL1 is held at the reference potential $V_{ref}$ of the GND level (ground potential). Then, the control signal DMPRS falls from the potential Vcc to the GND level. Thus, the n-channel transistor 6 of the reference voltage generation circuit 2 enters an OFF-state.

Figure 5:
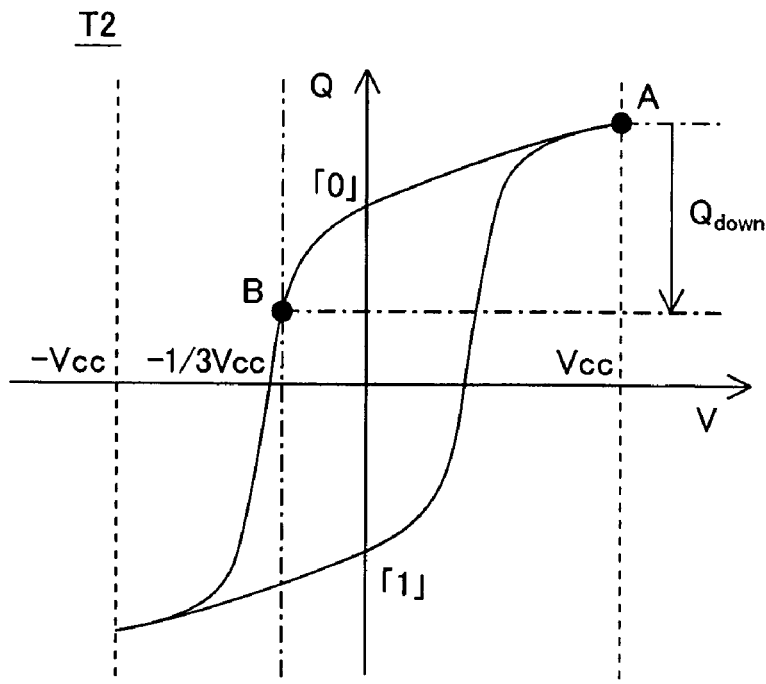

In a period T2 shown in FIG. 2, the plate line PL0 falls from the potential Vcc to a potential –⅓ Vcc. Thus, the voltage –⅓ Vcc is applied to the ferroelectric capacitor CF0. At this time, the polarization state of the ferroelectric capacitor CF0 shifts from the point A to a point B along the hysteresis curve as shown in FIG. 5, whether the ferroelectric capacitor CF0 holds the data "0" or the data "1". Thus, the total charge quantity of the bit line BL0 linked with the ferroelectric capacitor CF0 is reduced by a charge quantity $Q_{down}$ shown in FIG. 5. Therefore, the potential of the bit line BL0 is reduced in correspondence to the charge quantity $Q_{down}$ whether the ferroelectric capacitor CF0 holds the data "0" or the data "1".

If the ferroelectric capacitor CF0 holds the data "0", the total charge quantity of the bit line BL0 is changed by a quantity $(Q_{0up}-Q_{down})$ in the aforementioned periods T1 and T2. The charge quantity $Q_{0up}$ is less than the charge quantity $Q_{down}$ ($Q_{0up}<Q_{down}$) as understood from the shapes of the hysteresis curves shown in FIGS. 3 and 5, and hence the quantity $(Q_{0up}-Q_{down})$ is negative. Therefore, the bit line BL0, which has been at the GND level (ground potential) in the initial state, reaches a negative potential in the period T2 if the ferroelectric capacitor CF0 holds the data "0". If the ferroelectric capacitor CF0 holds the data "1", on the other hand, the total charge quantity of the bit line BL0 is changed by a quantity $(Q_{1up}-Q_{down})$ in the aforementioned periods T1 and T2. The charge quantity $Q_{1up}$ is greater than the charge quantity $Q_{down}$ ($Q_{1up}-Q_{down}$) as understood from the shapes of the hysteresis curves shown in FIGS. 4 and 5, and hence the quantity $(Q_{1up}-Q_{down})$ is positive. Therefore, the bit line BL0, which has been at the GND level (ground potential) in the initial state, reaches a positive potential in the period T2 if the ferroelectric capacitor CF0 holds the data "1".

Then, the control signal DMPE falls from the potential Vcc to the GND level. Thus, the n-channel transistor 5 of the reference voltage generation circuit 2 enters an OFF-state. Therefore, the bit line BL1 enters a floating state (high-impedance state) while holding the reference potential $V_{ref}$ of the GND level. In this state, the sense amplifier activation signal SAE rises from the GND level to the potential Vcc, thereby activating the sense amplifier 3. Thus, the sense amplifier 3 compares the potential of the bit line BL0 corresponding to the read data with the reference potential $V_{ref}$ of the bit line BL1, thereby determining and amplifying the data read from the ferroelectric capacitor CF0. In other words, the sense amplifier 3 determines the data read from the ferroelectric capacitor CF0 as the data "0" and sets the potential of the bit line BL0 to the GND level if the potential of the bit line BL0 is lower than the potential (reference potential $V_{ref}$=GND) of the bit line BL1. If the potential of the bit line BL0 is higher than the potential (reference potential $V_{ref}$=GND) of the bit line BL1, on the other hand, the sense amplifier 3 determines the data read from the ferroelectric capacitor CF0 as the data "1 and amplifies the potential of the bit line BL0 to the level Vcc. As hereinabove described, the bit line BL0 reaches a negative potential in the period T2 if the ferroelectric capacitor CF0 holds the data "0", and hence the sense amplifier 3 sets the potential of the bit line BL0 to the GND level. If the ferroelectric capacitor CF0 holds the data "1", on the other hand, the bit line BL0 reaches a positive potential in the period T2, and hence the sense amplifier 3 amplifies the potential of the bit line BL0 to the level Vcc. The potential of the bit line BL0 set to the GND level or the level Vcc by the sense amplifier 3 is output from the 1T1C ferroelectric memory.

According to the first embodiment, as hereinabove described, the 1T1C ferroelectric memory can set the reference potential $V_{ref}$ for determining the data "0" or "1" to the GND level (ground potential) by applying a voltage pulse to the ferroelectric capacitor CF0 through the plate line PL0 to generate a negative potential on the bit line BL0 if the ferroelectric capacitor CF0 holds the data "0" while generating a positive potential on the bit line BL0 if the ferroelectric capacitor CF0 holds the data "1" and thereafter reading the data. Thus, the 1T1C ferroelectric memory can easily set the reference potential $V_{ref}$ also when the potential generated on the bit line BL0 in data reading is dispersed.

Figure 6:
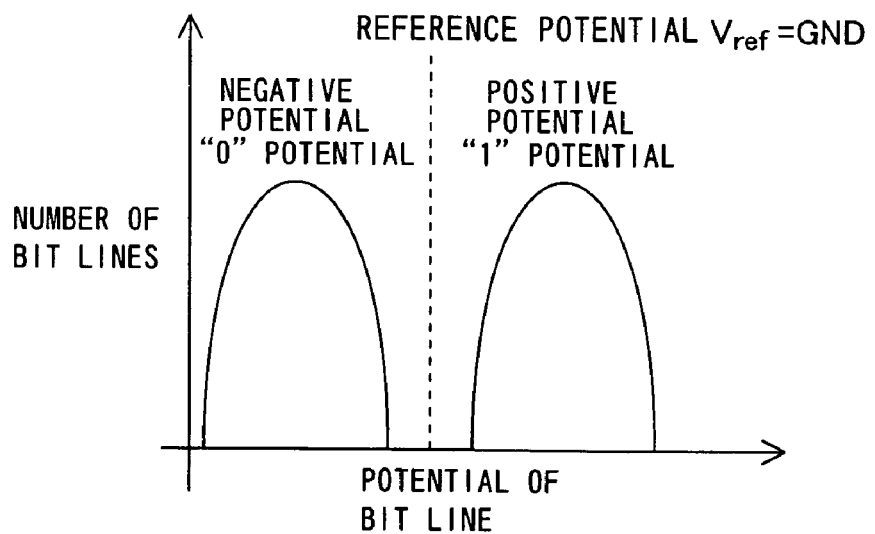
FIG. 6 illustrates potential distributions on a bit line in data reading in the 1T1C ferroelectric memory according to the first embodiment of the present invention.

According to the first embodiment, the 1T1C ferroelectric memory reads the data after applying the voltage pulse to the ferroelectric capacitor CF0 through the plate line PL0 to generate a negative potential on the bit line BL0 if the ferroelectric capacitor CF0 holds the data "0" while generating a positive potential on the bit line BL0 if the ferroelectric capacitor CF0 holds the data "1", whereby the potential generated on the bit line BL0 in data reading is distributed as shown in FIG. 6. Thus, the distribution range (negative potential) of the potential ("0" potential) of the bit line BL0 in the case of reading the data "0" from the ferroelectric capacitor CF0 and the distribution range (positive potential) of the potential ("1" potential) of the bit line BL0 in the case of reading the data "1" from the ferroelectric capacitor CF0 do not overlap with each other, whereby the 1T1C ferroelectric memory can correctly determine the data held in the ferroelectric capacitor CF0 as the data "0" or "1" by setting the reference potential $V_{ref}$ to the GND level (ground potential).

According to the first embodiment, the 1T1C ferroelectric memory, capable of setting the reference potential $V_{ref}$ for determining the data "0" or "1" to the GND level (ground potential), can employ the potential of the generally employed GND level as the reference potential $V_{ref}$. Thus, no circuit may be separately provided for generating the reference potential $V_{ref}$ dissimilarly to a case of setting the reference potential $V_{ref}$ to a level other than the GND level, whereby the circuit structure of the 1T1C ferroelectric memory can be simplified.

Second Embodiment

A 1T1C ferroelectric memory according to a second embodiment of the present invention reads data from a ferroelectric capacitor by applying a voltage pulse to the ferroelectric capacitor after previously setting a bit line linked with the ferroelectric capacitor to a negative potential, dissimilarly to the 1T1C ferroelectric memory according to the aforementioned first embodiment. Operations of the 1T1C ferroelectric memory according to the second embodiment are now described with reference to FIGS. 1 and 7 to 15. The circuit structure of the 1T1C ferroelectric memory according to the second embodiment is absolutely similar to that of the 1T1C ferroelectric memory according to the first embodiment shown in FIG. 1.

Figure 7:
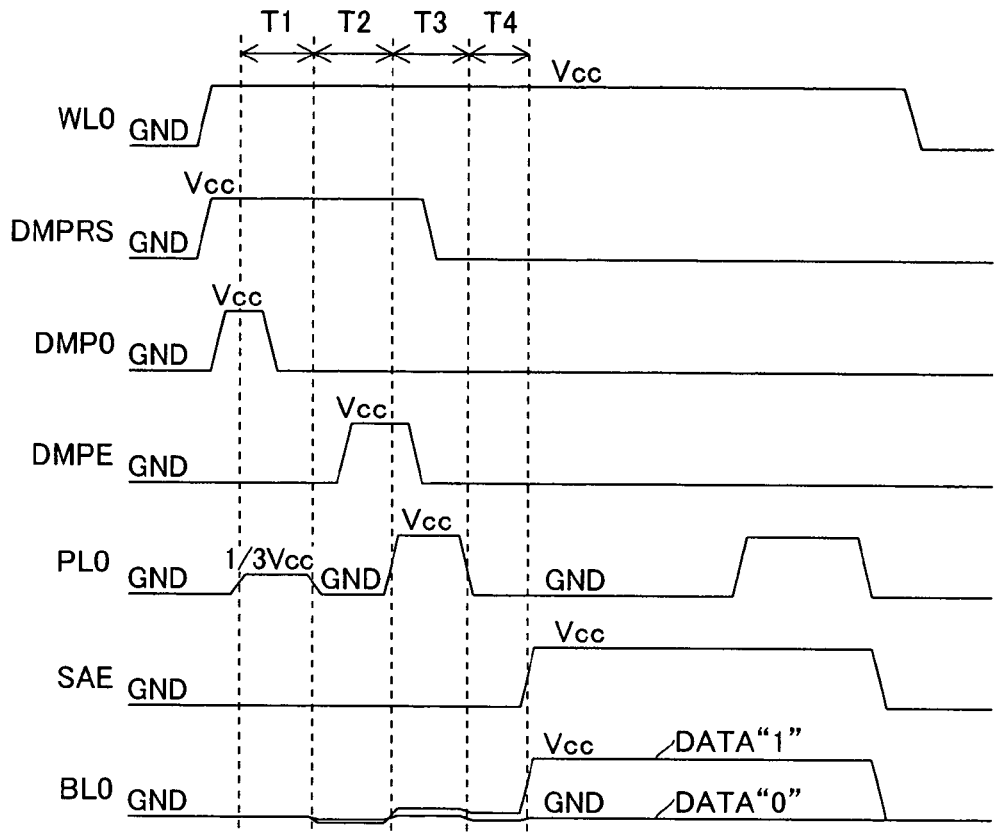
FIG. 7 is a voltage waveform diagram for illustrating operations of a 1T1C ferroelectric memory according to a second embodiment of the present invention.

In the 1T1C ferroelectric memory according to the second embodiment, the potentials of a word line WL0, a plate line PL0 and a bit line PL0 are held at the GND level in an initial state of data reading, as shown in FIG. 7. The potentials of control signals DMPRS, DMP0 and DMPE and a sense amplifier activation signal SAE are also held at the GND level. The word line WL0 rises from the GND level to a potential Vcc. Thus, an access transistor Tr0 linked with the word line WL0 enters an ON-state. The control signal DMPRS also rises from the GND level to the potential Vcc. Thus, an n-channel transistor 6 of a reference voltage generation circuit 2 enters an ON-state. Therefore, a reference potential $V_{ref}$ of the GND level (ground potential) is supplied through the ON-state n-channel transistor 6, thereby setting the potentials of nodes ND1 and ND2 to the GND level while charging a capacitor 7 with the reference potential $V_{ref}$ of the GND level. Then, the control signal DMP0 rises from the GND level to the potential Vcc. Thus, an n-channel transistor 4 of the reference voltage generation circuit 2 enters an ON-state. Therefore, the reference potential $V_{ref}$ of the GND level is supplied to the bit line BL0 through the ON-state n-channel transistor 4. Thus, the potential of the bit line BL0 is held at the GND level.

Figure 8:
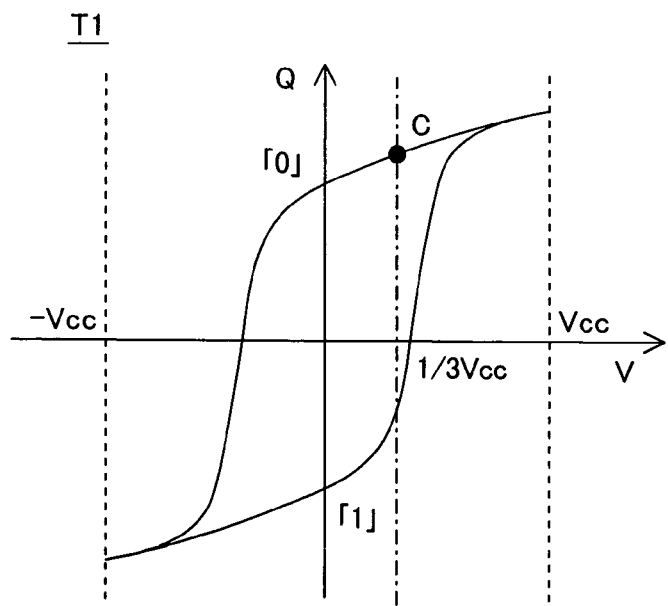
FIGS. 8 to 15 are hysteresis diagrams showing polarization states of a ferroelectric capacitor of the 1T1C ferroelectric memory according to the second embodiment of the present invention.
Figure 12:
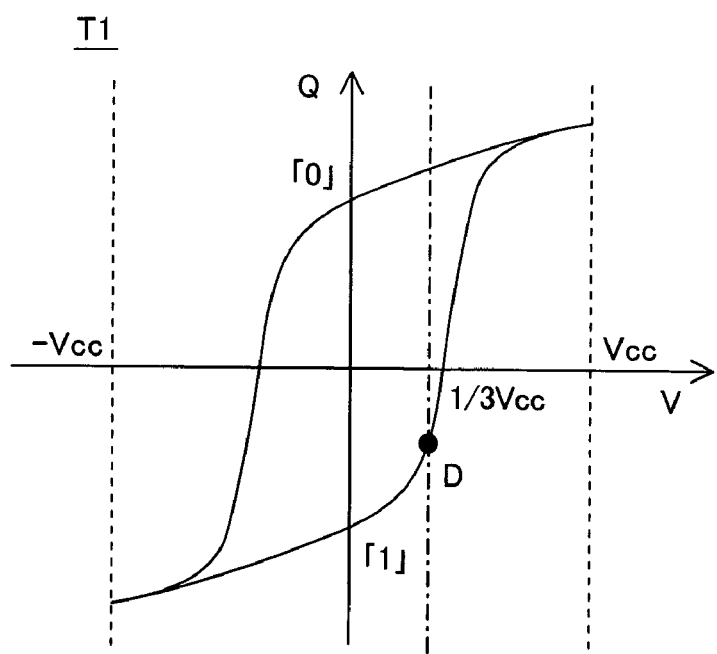

According to the second embodiment, the plate line PL0 rises from the GND level to a potential ⅓ Vcc in a period T1 shown in FIG. 7. Thus, the voltage ⅓ Vcc is applied to a ferroelectric capacitor CF0 through the plate line PL0. At this time, the polarization state of the ferroelectric capacitor CF0 shifts from "0" to a point C as shown in FIG. 8, if the ferroelectric capacitor CF0 holds data "0". If the ferroelectric capacitor CF0 holds data "1", on the other hand, the polarization state of the ferroelectric capacitor CF0 shifts from "1" to a point D as shown in FIG. 12. At this time, the potential of the bit line BL0 linked with the ferroelectric capacitor CF0 is fixed to the GND level, to remain intact at the GND level regardless of the polarization state of the ferroelectric capacitor CF0. Thereafter the control signal DMP0 falls from the potential Vcc to the GND level. Thus, the n-channel transistor 4 of the reference voltage generation circuit 2 enters an OFF-state. Therefore, the bit line BL0 enters a floating state (high-impedance state) while holding the potential of the GND level.

Figure 9:
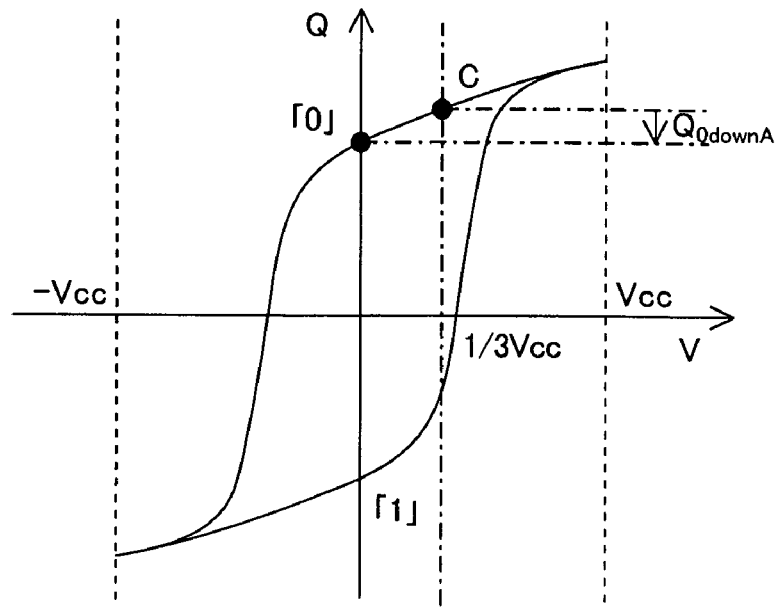
Figure 13:
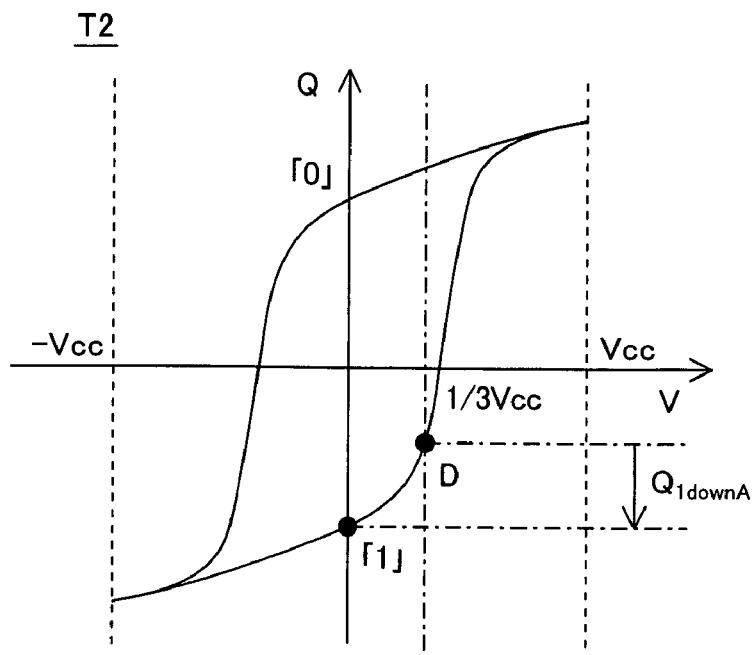

According to the second embodiment, the plate line PL0 falls from the potential ⅓ Vcc to the GND level in a period T2 shown in FIG. 7. Thus, a voltage of the GND level is applied to the ferroelectric capacitor CF0. Therefore, the polarization state of the ferroelectric capacitor CF0 shifts from the point C to "0" along a hysteresis curve as shown in FIG. 9, if the ferroelectric capacitor CF0 holds the data "0". Thus, the total charge quantity of the bit line BL0 linked with the ferroelectric capacitor CF0 is reduced by a charge quantity $Q_{0downA}$ shown in FIG. 9. Therefore, the potential of the bit line BL0 is reduced from the GND level in correspondence to the charge quantity $Q_{0downA}$, thereby reaching a negative level. If the ferroelectric capacitor CF0 holds data "1", on the other hand, the polarization state of the ferroelectric capacitor CF0 shifts from the point D to "1" along the hysteresis curve, as shown in FIG. 13. Thus, the total charge quantity of the bit line BL0 linked with the ferroelectric capacitor CF0 is reduced by a charge quantity $Q_{1downA}$ shown in FIG. 13. Therefore, the potential of the bit line BL0 is reduced from the GND level in correspondence to the charge quantity $Q_{1downA}$, to reach a negative level. As described above, the 1T1C ferroelectric memory according to the second embodiment sets the bit line BL0 to a negative potential in the period T2. Thereafter the control signal DMPE rises from the GND level to the potential Vcc. Thus, an n-channel transistor 5 of the reference voltage generation circuit 2 enters an ON-state. Therefore, the reference potential $V_{ref}$ of the GND level having been held in the capacitor 7 is supplied to a bit line BL1 through the ON-state n-channel transistor 5. Thus, the bit line BL1 reaches the reference potential $V_{ref}$ of the GND level.

Figure 10:
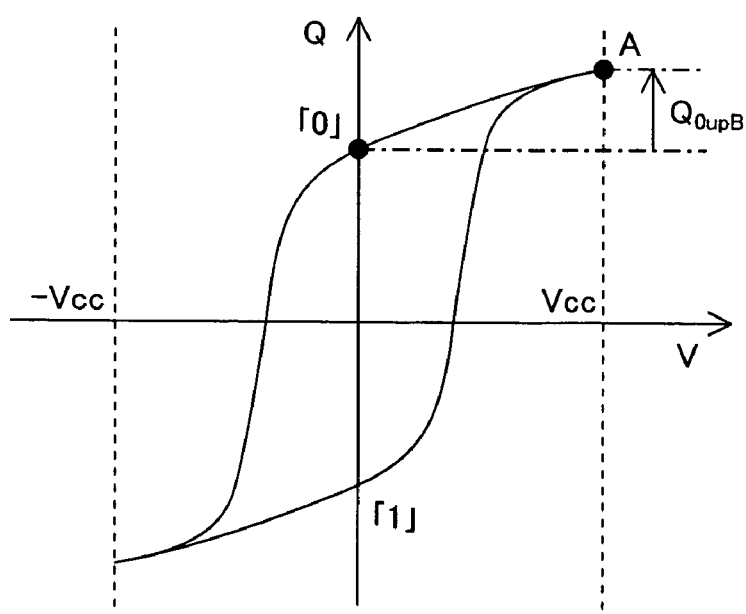
Figure 14:
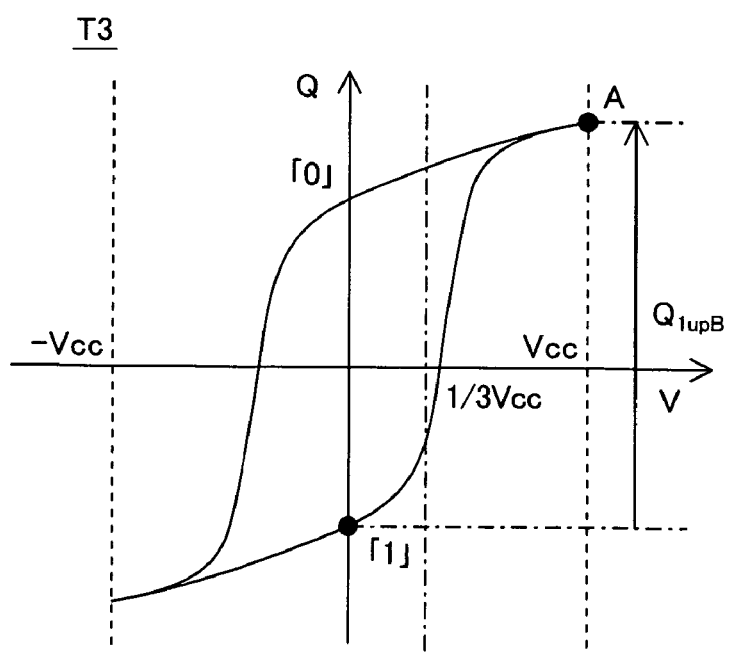

According to the second embodiment, a voltage pulse is applied to the ferroelectric capacitor CF0 through the plate line PL0 for stepping up the same to the potential Vcc in a period T3 shown in FIG. 7. More specifically, the plate line PL0 rises from the GND level to the potential Vcc. Thus, the voltage Vcc is applied to the ferroelectric capacitor CF0 through the plate line PL0. Therefore, the polarization state of the ferroelectric capacitor CF0 shifts from "0" to a point A along the hysteresis curve as shown in FIG. 10, if the ferroelectric capacitor CF0 holds the data "0". Thus, the total charge quantity of the bit line BL0 linked with the ferroelectric capacitor CF0 is increased by a charge quantity $Q_{0upB}$ shown in FIG. 10. Therefore, the potential of the bit line BL0 is increased in correspondence to the charge quantity $Q_{0upB}$. If the ferroelectric capacitor CF0 holds the data "1", on the other hand, the polarization state of the ferroelectric capacitor CF0 shifts from "1" to the point A along the hysteresis curve as shown in FIG. 14. Thus, the total charge quantity of the bit line BL0 linked with the ferroelectric capacitor CF0 is increased by a charge quantity $Q_{1upB}$ shown in FIG. 14. Therefore, the potential of the bit line BL0 is increased in correspondence to the charge quantity $Q_{1upB}$. Thereafter the control signal DMPE falls from the potential Vcc to the GND level. Thus, the n-channel transistor 5 of the reference voltage generation circuit 2 enters an OFF-state. Therefore, the bit line BL1 enters a floating state (high-impedance state) while holding the reference potential $V_{ref}$ of the GND level. The control signal DMPRS falls from the potential Vcc to the GND level. Thus, the n-channel transistor 6 of the reference voltage generation circuit 2 enters an OFF-state.

Figure 11:
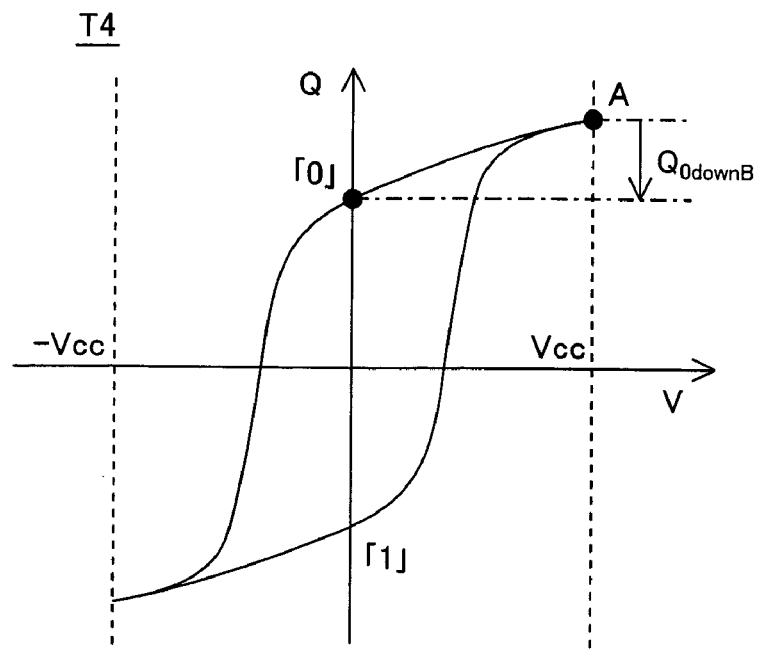
Figure 15:
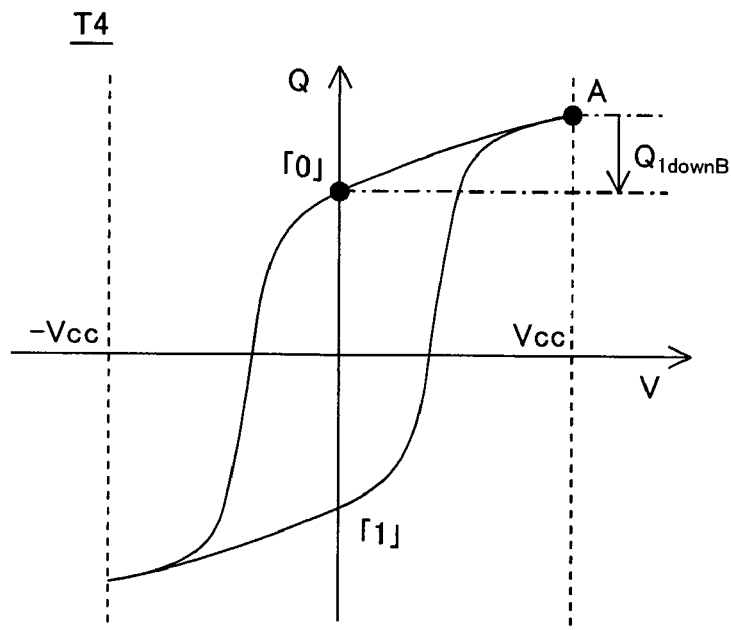

In a period T4 shown in FIG. 7, the plate line PL0 falls from the potential Vcc to the GND level. Thus, a voltage of the GND level is applied to the ferroelectric capacitor CF0 through the plate line PL0. Therefore, the polarization state of the ferroelectric capacitor CF0 shifts from the point A to "0" along the hysteresis curve as shown in FIG. 11 if the ferroelectric capacitor CF0 holds the data "0". Thus, the total charge quantity of the bit line BL0 linked with the ferroelectric capacitor CF0 is reduced by a charge quantity $Q_{0downB}$ shown in FIG. 11. Therefore, the potential of the bit line BL0 is reduced in correspondence to the charge quantity $Q_{0downB}$. Also when the ferroelectric capacitor CF0 holds the data "1", the polarization state of the ferroelectric capacitor CF0 shifts from the point A to "0" along the hysteresis curve as shown in FIG. 15. Thus, the total charge quantity of the bit line BL0 linked with the ferroelectric capacitor CF0 is reduced by a charge quantity $Q_{1downB}$ ($=Q_{0downB}$) shown in FIG. 15. Therefore, the potential of the bit line BL0 is reduced in correspondence to the charge quantity $Q_{1downB}$.

If the ferroelectric capacitor CF0 holds the data "0", the total charge quantity of the bit line BL0 is changed by a quantity ($-Q_{0downA}+Q_{0upB}-Q_{0downB}$) in the periods T1 to T4 shown in FIG. 7. The charge quantity $Q_{0upB}$ is equal to the charge quantity $Q_{0downB}$ ($Q_{0upB}=Q_{0downB}$) as understood from the hysteresis curves shown in FIGS. 9 to 11, and hence the total charge quantity of the bit line BL0 is changed by a negative quantity in the periods T1 to T4. The bit line BL0, which has been at the GND level in the initial state, reaches a negative potential in the period T4 if the ferroelectric capacitor CF0 holds the data "0". If the ferroelectric capacitor CF0 holds the data "1", on the other hand, the total charge quantity of the bit line BL0 is changed by a quantity ($-Q_{1downA}+Q_{1upB}-Q_{1downB}$) in the periods T1 to T4. The quantity ($-Q_{1downA}+Q_{1upB}-Q_{1downB}$) is positive, as understood from the hysteresis curves shown in FIGS. 13 to 15. Therefore, the total charge quantity of the bit line BL0 is changed by a positive quantity in the periods T1 to T4. The bit line BL0, which has been at the GND level in the initial state, reaches a positive potential in the period T4 if the ferroelectric capacitor CF0 holds the data "1".

Then, the sense amplifier activation signal SAE rises from the GND level to the potential Vcc, thereby activating a sense amplifier 3. Thus, the sense amplifier 3 determines the data read from the ferroelectric capacitor CF0 to the bit line BL0 as the data "0" or "1" and amplifies the same, similarly to the aforementioned first embodiment. If the ferroelectric capacitor CF0 holds the data "0", the bit line BL0 reaches a negative potential in the period T4, and hence the sense amplifier 3 sets the bit line BL0 to the GND level. If the ferroelectric capacitor CF0 holds the data "1", on the other hand, the bit line BL0 reaches a positive potential in the period T4, and hence the sense amplifier 3 amplifies the potential of the bit line BL0 to the level Vcc. Then, the potential of the bit line BL0 set to the GND level or the level Vcc by the sense amplifier 3 is output from the 1T1C ferroelectric memory.

According to the second embodiment, as hereinabove described, the 1T1C ferroelectric memory, capable of easily generating a negative potential on the bit line BL0 if the ferroelectric capacitor CF0 holds the data "0" while generating a positive potential on the bit line BL0 if the ferroelectric capacitor CF0 holds the data "1" by applying the voltage pulse to the ferroelectric capacitor CF0 after previously setting the bit line BL0 linked with the ferroelectric capacitor CF0 to a negative potential and reading the data from the ferroelectric capacitor CF0, can set the reference potential $V_{ref}$ for determining the data "0" or "1" to the GND level (ground potential). Thus, the 1T1C ferroelectric memory can easily set the reference potential $V_{ref}$ also when the potential generated on the bit line BL0 in data reading is dispersed. According to the second embodiment, further, the 1T1C ferroelectric memory can easily generate a negative potential on the bit line BL0 if the ferroelectric capacitor CF0 holds the data "0" while generating a positive potential on the bit line BL0 if the ferroelectric capacitor CF0 holds the data "1" in data reading, whereby the distribution range (negative potential) of the potential of the bit line BL0 in the case of reading the data "0" from the ferroelectric capacitor CF0 and the distribution range (positive potential) of the potential of the bit line BL0 in the case of reading the data "1" from the ferroelectric capacitor CF0 do not overlap with each other. Thus, the 1T1C ferroelectric memory can correctly determine the data held in the ferroelectric capacitor CF0 as the data "0" or "1" by setting the reference potential $V_{ref}$ to the GND level.

The remaining effects of the second embodiment are similar to those of the aforementioned first embodiment.

Third Embodiment

The structure of a 1T1C ferroelectric memory according to a third embodiment of the present invention is now described with reference to FIG. 16.

Figure 16:
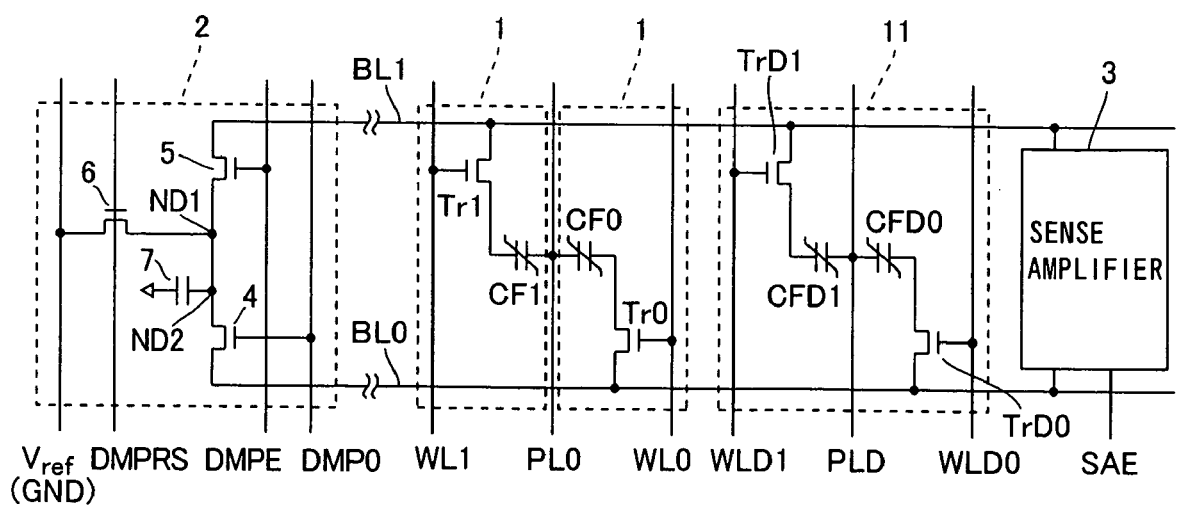
FIG. 16 is a circuit diagram showing the structure of a 1T1C ferroelectric memory according to a third embodiment of the present invention.

As shown in FIG. 16, the 1T1C ferroelectric memory according to the third embodiment comprises a dummy circuit 11 for setting a bit line BL0 to a negative potential before reading data of a ferroelectric capacitor CF0 on the bit line BL0 by applying a voltage pulse to the ferroelectric capacitor CF0, dissimilarly to the 1T1C ferroelectric memory according to the aforementioned first embodiment. This dummy circuit 11 is provided every bit line pair BL0/BL1. The dummy circuit 11 is formed by dummy ferroelectric capacitors CFD0 and CFD1 and dummy access transistors TrD0 and TrD1 consisting of n-channel transistors. A first electrode of the dummy ferroelectric capacitor CFD0 is connected to a dummy plate line PLD, while a second electrode thereof is connected to either the source or the drain of the dummy access transistor TrD0. The dummy plate line PLD is an example of the "dummy driving line" in the present invention. Either the drain or the source of the dummy access transistor TrD0 is connected to the bit line BL0. The gate of the dummy access transistor TrD0 is connected to a dummy word line WLD0. A first electrode of the dummy ferroelectric capacitor CFD1 is connected to the dummy plate line PLD, while a second electrode thereof is connected to either the source or the drain of the dummy access transistor TrD1. Either the drain or the source of the dummy access transistor TrD1 is connected to the bit line BL1. The gate of the dummy access transistor TrD1 is connected to a dummy word line WLD1. The remaining structure of the 1T1C ferroelectric memory according to the third embodiment is similar to that of the 1T1C ferroelectric memory according to the aforementioned first embodiment.

Operations of the 1T1C ferroelectric memory according to the third embodiment of the present invention are now described with reference to FIGS. 8, 9, 12, 13, 16 and 17.

The 1T1C ferroelectric memory according to the third embodiment sets the bit line BL0 to a negative potential through the dummy circuit 11 before applying a voltage pulse to the ferroelectric capacitor CF0 (see FIG. 16) through the plate line PL0 for reading data of the ferroelectric capacitor CF0 on the bit line BL0, dissimilarly to the 1T1C ferroelectric memory according to the aforementioned second embodiment. More specifically, control signals DMPRS and DMP0 and the dummy word line WLD0 rise to a potential Vcc, thereby turning on n-channel transistors 6 and 4 of a reference voltage generation circuit 2 and the dummy access transistor TrD0. In a period T1 shown in FIG. 17, the bit line BL0 is supplied with a reference potential $V_{ref}$ of the GND level while the dummy plate line PLD rises from the GND level to a potential ⅓ Vcc. Thus, the voltage ⅓ Vcc is applied to the dummy ferroelectric capacitor CFD0 through the dummy plate line PLD. If the dummy ferroelectric capacitor CFD0 holds data "0", the polarization state of the dummy ferroelectric capacitor CFD0 shifts from "0" to a point C, as shown in FIG. 8. If the dummy ferroelectric capacitor CFD0 holds data "1", on the other hand, the polarization state of the dummy ferroelectric capacitor CFD0 shifts from "1" to a point D, as shown in FIG. 12. Despite this change of the polarization state of the dummy ferroelectric capacitor CFD0, the potential of the bit line BL0 linked with the ferroelectric capacitor CF0 remains intact at the GND level due to the reference potential $V_{ref}$ of the GND level supplied thereto. Thereafter the control signal DMP0 falls from the potential Vcc to the GND level. Thus, an n-channel transistor 4 of the reference voltage generation circuit 2 enters an OFF-state. Therefore, the bit line BL0 enters a floating state (high-impedance state) while holding the potential of the GND level.

Figure 17:
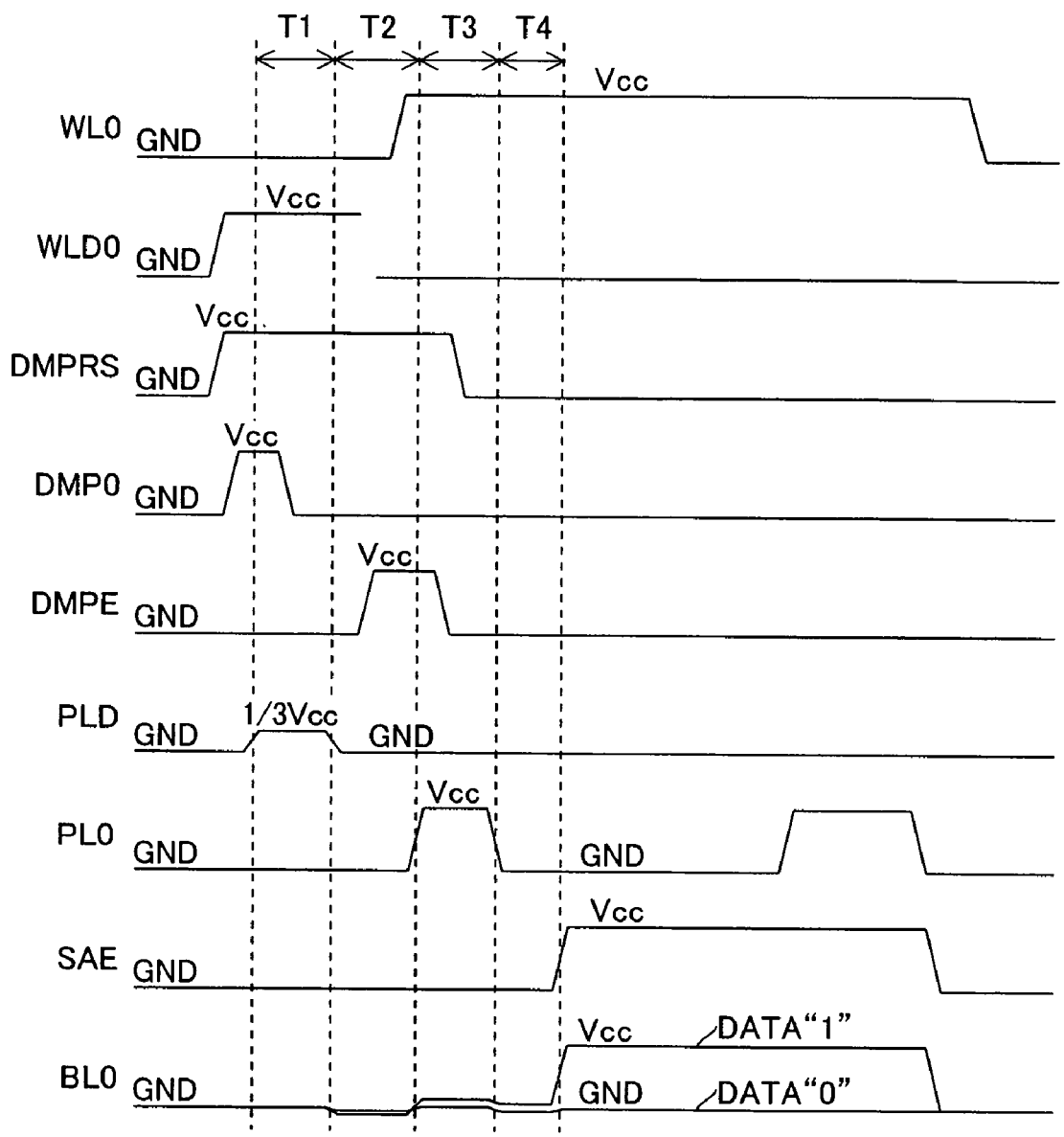
FIG. 17 is a voltage waveform diagram for illustrating operations of the 1T1C ferroelectric memory according to the third embodiment of the present invention.

In a period T2 shown in FIG. 17, the dummy plate line PLD falls from the potential ⅓ Vcc to the GND level. Thus, a voltage of the GND level is applied to the dummy ferroelectric capacitor CF0. Therefore, the polarization state of the dummy ferroelectric capacitor CFD0 shifts from the point C to "0" along a hysteresis curve if the dummy ferroelectric capacitor CFD0 holds the data "0", similarly to the case of the second embodiment shown in FIG. 9. Thus, the total charge quantity of the bit line BL0 linked with the dummy ferroelectric capacitor CFD0 is reduced by a charge quantity $Q_{0downA}$ shown in FIG. 9. Therefore, the potential of the bit line BL0 is reduced from the GND level in correspondence to the charge quantity $Q_{0downA}$, to reach a negative level. If the dummy ferroelectric capacitor CFD0 holds the data "1", on the other hand, the polarization state of the dummy ferroelectric capacitor CFD0 shifts from the point D to "1" along the hysteresis curve, similarly to the case of the second embodiment shown in FIG. 13. Thus, the total charge quantity of the bit line BL0 linked with the dummy ferroelectric capacitor CFD0 is reduced by a charge quantity $Q_{1downA}$ shown in FIG. 13. Therefore, the potential of the bit line BL0 is reduced from the GND level in correspondence to the charge quantity $Q_{1downA}$, to reach a negative level.

As described above, the 1T1C ferroelectric memory according to the third embodiment sets the bit line BL0 to a negative potential through the dummy circuit 11 in the period T2 shown in FIG. 17. Therefore, the 1T1C ferroelectric memory according to the third embodiment does not apply a voltage ⅓ Vcc to the ferroelectric capacitor CF0 of a memory cell 1 through the plate line PL0 in order to set the bit line BL0 to a negative potential in the period T2. According to the third embodiment, the 1T1C ferroelectric memory generates a negative potential on the bit line BL0 if the ferroelectric capacitor CF0 holds the data "0" while generating a positive potential on the bit line BL0 if the ferroelectric capacitor CF0 holds the data "1" after the period T2 shown in FIG. 17, similarly to the operation (FIG. 7) of the aforementioned second embodiment following the period T2. The remaining operations of the 1T1C ferroelectric memory according to the third embodiment are similar to those of the 1T1C ferroelectric memory according to the aforementioned second embodiment.

According to the third embodiment, the 1T1C ferroelectric memory can reduce the potential of the bit line BL0 from the GND level to a prescribed negative potential through the dummy plate line PLD and the dummy ferroelectric capacitor CFD0 before applying a voltage pulse to the ferroelectric capacitor CF0 through the plate line PL0 by setting the dummy plate line PLD to the potential ⅓ Vcc while holding the potential of the bit line BL0 at the GND level, thereafter bringing the bit line BL0 into a floating state and thereafter reducing the potential of the dummy plate line PLD from the level ⅓ Vcc to the GND level before applying the voltage pulse to the ferroelectric capacitor CF0 through the plate line PL0. Thus, the 1T1C ferroelectric memory can reduce the potential of the bit line BL0 from the GND level to the prescribed negative level without applying the voltage ⅓ Vcc to the ferroelectric capacitor CF0 holding data, dissimilarly to a case of reducing the potential of the bit line BL0 from the GND level to a prescribed negative level through the plate line PL0 and the ferroelectric capacitor CF0. Therefore, the 1T1C ferroelectric memory can set the bit line BL0 to a negative potential while suppressing the ferroelectric capacitor CF0 holding data from disturbance resulting from the voltage ⅓ Vcc before applying the voltage pulse to the ferroelectric capacitor CF0 for reading the data in data reading.

The remaining effects of the third embodiment are similar to those of the aforementioned first embodiment.

Fourth Embodiment

Figure 18:
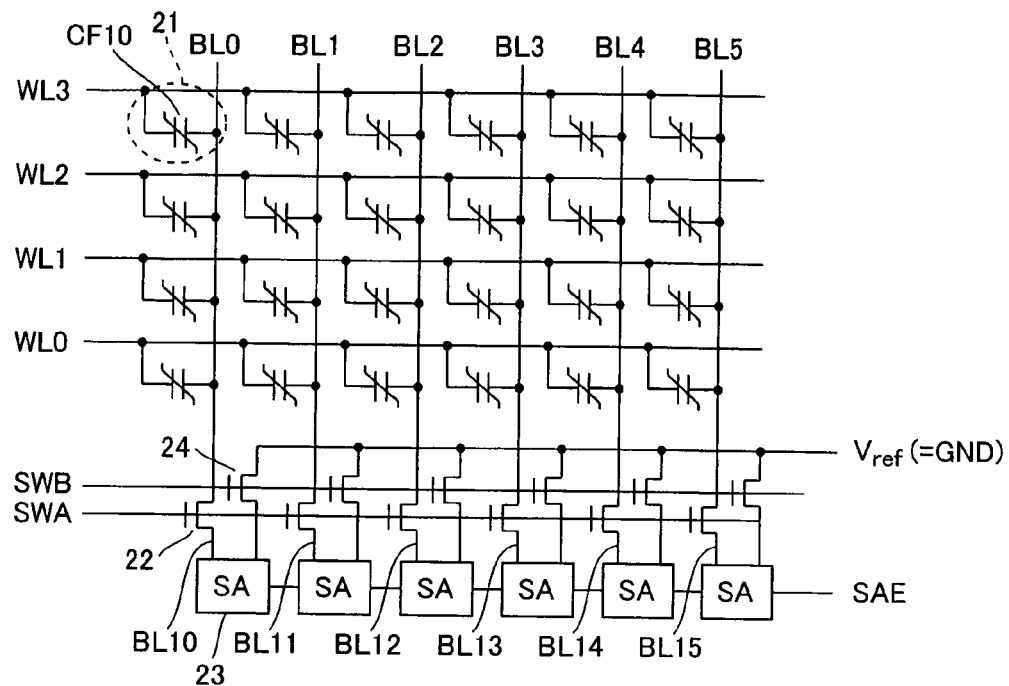
FIG. 18 is a circuit diagram showing the structure of a cross-point ferroelectric memory according to a fourth embodiment of the present invention.

Referring to FIG. 18, a fourth embodiment of the present invention is applied to a cross-point ferroelectric memory, dissimilarly to the aforementioned first to third embodiments.

In the cross-point ferroelectric memory according to the fourth embodiment, word lines WL0 to WL3 and bit lines BL0 to BL5 are arranged to extend perpendicularly to each other, as shown in FIG. 18. The word lines WL0 to WL3 are examples of the "driving line" in the present invention, and the bit lines BL0 to BL5 are examples of the "data line" in the present invention. Memory cells 21 formed by only single ferroelectric capacitors CF10 are provided on the positions of intersection between the word lines WL0 to WL3 and the bit lines BL0 to BL5 respectively. First ends of the bit lines BL0 to BL5 are connected to either the sources or the drains of switching transistors 22 consisting of n-channel transistors provided for the respective ones of the bit lines BL0 to BL5. These switching transistors 22 are provided for inhibiting potentials amplified by sense amplifiers 23 described later from flowing back toward the bit lines BL0 to BL5 and ferroelectric capacitors CF10 in data reading. A control signal SWA is input in the gates of the switching transistors 22 for ON-OFF controlling the switching transistors 22, while either the drains or the sources of the switching transistors 22 are connected to bit lines BL10 to BL15.

The bit lines BL10 to BL15 are connected with the sense amplifiers 23 provided for the respective ones of the bit lines BL10 to BL15 (BL0 to BL5). Each amplifier 23 has a function of amplifying difference between the potential of the corresponding one of the bit lines BL10 to BL15 and a reference potential $V_{ref}$ by comparing a potential, corresponding to data held in the corresponding ferroelectric capacitor CF10, generated on the corresponding one of the bit lines BL10 to BL15 with the reference potential $V_{ref}$ of the GND level (ground potential) and determining the difference therebetween when the memory reads the data from the corresponding ferroelectric capacitor CF10. Either the sources or the drains of switching transistors 24 consisting of n-channel transistors are connected to the sense amplifiers 23. A control signal SWB is input in the gates of the switching transistors 24 for ON-OFF controlling the switching transistors 24, while the reference potential $V_{ref}$ of the GND level is supplied to either the drains or the sources of the switching transistors 24. A sense amplifier activation signal SAE is input in the sense amplifiers 23 for activating the same.

Operations of the cross-point ferroelectric memory according to the fourth embodiment of the present invention are now described with reference to FIGS. 3 to 5, 18 and 19. In the following description, it is assumed that the cross-point ferroelectric memory collectively reads data from all memory cells 21 linked with the word line WL3. It is also assumed that the ferroelectric capacitors CF10 linked with the word line WL3 and the bit lines BL0 to BL2 hold data "0" while the ferroelectric capacitors CF10 linked with the word line WL3 and the bit lines BL3 to BL5 hold data "1" respectively.

Figure 19:
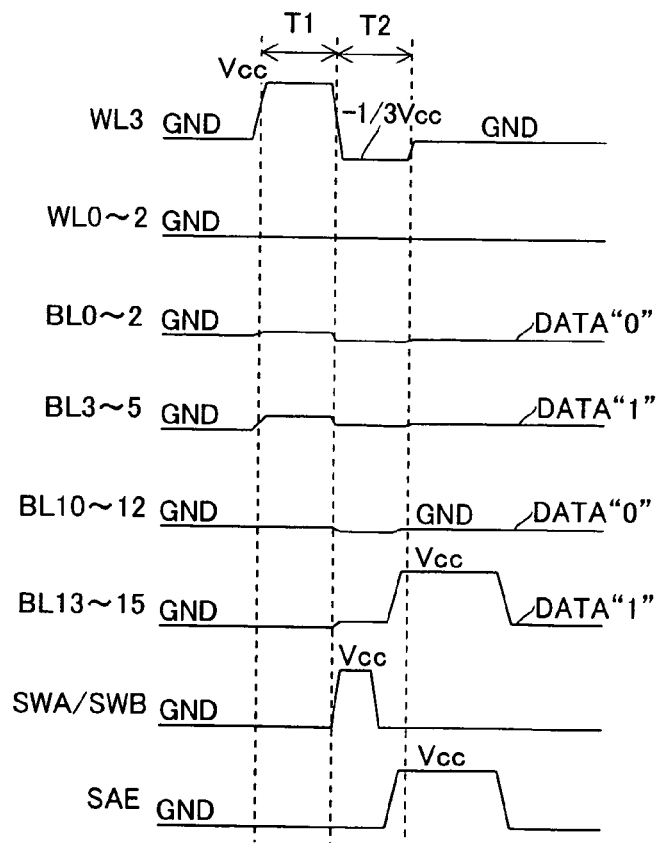
FIG. 19 is a voltage waveform diagram for illustrating operations of the cross-point ferroelectric memory according to the fourth embodiment of the present invention.

In an initial state of data reading, the potentials of the word lines WL0 to WL3 and the bit lines BL0 to BL5 and BL10 to BL15 are held at the GND level, as shown in FIG. 19. The potentials of the control signals SWA and SWB and the sense amplifier activation signal SAE are also held at the GND level. The cross-point ferroelectric memory brings the bit lines BL0 to BL5 into floating states, and thereafter selects the word line WL3 and applies a voltage pulse to all ferroelectric capacitors CF10 linked with the word line WL3 for stepping up the same to a potential Vcc in a period T1 shown in FIG. 19. More specifically, the word line WL3 rises from the GND level to the potential Vcc. Thus, the voltage Vcc is applied to all ferroelectric capacitors CF10 linked with the word line WL3. At this time, the polarization states of the ferroelectric capacitors CF10 linked with the word line WL3 and the bit lines BL0 to BL2 shift from "0" to a point A, similarly to the case of the first embodiment shown in FIG. 3. Thus, the total charge quantity of the bit lines BL0 to BL2 is increased in correspondence to a charge quantity $Q_{0up}$. On the other hand, the polarization states of the ferroelectric capacitors CF10 linked with the word line WL3 and the bit lines BL3 to BL5 shift from "0" to the point A, similarly to the case of the first embodiment shown in FIG. 4. Thus, the total charge quantity of the bit lines BL3 to BL5 is increased in correspondence to a charge quantity $Q_{1up}$ in FIG. 4. Therefore, the potentials of the bit lines BL3 to BL5 are increased in correspondence to the charge quantity $Q_{1up}$.

In a period T2 shown in FIG. 19, the word line WL3 falls from the potential Vcc to a potential $-\frac{1}{3}$ Vcc. Thus, the voltage $-\frac{1}{3}$ Vcc is applied to all ferroelectric capacitors CF10 linked with the word line WL3. At this time, the polarization states of the ferroelectric capacitors CF10 linked with the word line WL3 and the bit lines BL0 to BL5 shift from the point A to a point B along a hysteresis curve, similarly to the case of the first embodiment shown in FIG. 5. Thus, the total charge quantity of the bit lines BL0 to BL5 is increased by a charge quantity $Q_{down}$ shown in FIG. 5. Therefore, the potentials of the bit lines BL0 to BL5 are reduced in correspondence to the charge quantity $Q_{down}$.

The total charge quantity of the bit lines BL0 to BL2 is changed by a quantity $(Q_{0up}-Q_{down})$ in the periods T1 and T2 shown in FIG. 19. The charge quantity $Q_{0up}$ is less than the charge quantity $Q_{down}$ ($Q_{0up}<Q_{down}$) as understood from the shapes of the hysteresis curves shown in FIGS. 3 and 5, and hence the quantity $(Q_{0up}-Q_{down})$ is negative. Therefore, the bit lines BL0 to BL2, which have been at the GND level (ground potential) in the initial state, reach negative potentials in the period T2.

In the period T2 shown in FIG. 19, the control signals SWA and SWB rise from the GND level to the potential Vcc. Thus, the switching transistors 22 and 24 enter ON-states. Thus, the potentials of the bit lines BL0 to BL5 are transmitted to the bit lines BL10 to BL15 through the ON-state switching transistors 22 respectively. Therefore, the potentials of the bit lines BL10 to BL12 reach negative levels while the potentials of the bit lines BL13 to BL15 reach positive levels. Further, the reference potential $V_{ref}$ of the GND level is supplied to the sense amplifiers 23 through the ON-state switching transistors 24. Thereafter the control signals SWA and SWB fall from the potential Vcc to the GND level. Thus, the switching transistors 22 and 24 enter OFF-states.

In this state, the sense amplifier activation signal SAE falls from the GND level to the potential Vcc, thereby activating the sense amplifiers 22. Thus, the sense amplifiers 23 compare the potentials of the bit lines BL10 to BL15 corresponding to the read data with the reference potential $V_{ref}$ of the GND level respectively, thereby determining the data read from the ferroelectric capacitors CF10 and amplifying the same. This operation for determining the data is similar to the data determination operation of the sense amplifier 3 according to the aforementioned first embodiment. In other words, the sense amplifiers 23 set the bit lines BL10 to BL12 corresponding to data "0", exhibiting negative potentials lower than the reference potential $V_{ref}$ of the GND level, to the GND level. On the other hand, the sense amplifiers 23 amplify the positive potentials, higher than the reference potential $V_{ref}$ of the GND level, of the bit lines BL13 to BL15 corresponding to data "1" to the level Vcc. The potentials of the bit lines BL10 to BL15 set to the GND level and the level Vcc by the sense amplifiers 23 respectively are output from the cross-point ferroelectric memory. When the sense amplifiers 23 amplify the potentials of the bit lines BL10 to BL15, the switching transistors 22 are in OFF-states for inhibiting the amplified potentials of the bit lines BL10 to BL15 from flowing back toward the bit lines BL0 to BL5 and the ferroelectric capacitors CF10.

As hereinabove described, the cross-point ferroelectric memory according to the fourth embodiment can set the reference potential $V_{ref}$ for determining the data "0" or "1" to the GND level (ground potential) by applying a voltage pulse to the ferroelectric capacitors CF10 through the word line WL3 to generate negative potentials on the bit lines BL10 to BL12 linked with the ferroelectric capacitors CF10 holding the data "0" and to generate positive potentials on the bit lines BL13 to BL15 linked with the ferroelectric capacitors CF10 holding the data "1" respectively and thereafter collectively reading the data from the ferroelectric capacitors CF10 linked with the word line WL3. Thus, the cross-point ferroelectric memory can easily set the reference potential $V_{ref}$ also when the potentials generated on the bit lines BL10 to BL15 in data reading are dispersed.

Further, the cross-point ferroelectric memory according to the fourth embodiment applies a voltage pulse to the ferroelectric capacitors CF10 through the word line WL3 to generate negative potentials on the bit lines BL10 to BL12 linked with the ferroelectric capacitors CF10 holding the data "0" and to generate positive potentials on the bit lines BL13 to BL15 linked with the ferroelectric capacitors CF10 holding the data "1" respectively and thereafter collectively reads the data from the ferroelectric capacitors CF10 linked with the word line WL3, so that the distribution range of the potentials (negative potentials) of the bit lines BL10 to BL12 reading the data "0" from the ferroelectric capacitors CF10 and that of the potentials (positive potentials) of the bit lines BL13 to BL15 reading the data "1" from the ferroelectric capacitors CF10 do not overlap with each other in data reading. Thus, the cross-point ferroelectric memory can correctly determine the data held in each ferroelectric capacitor CF10 as the data "0" or "1" by setting the reference potential $V_{ref}$ to the GND level (ground potential).

The remaining effects of the fourth embodiment are similar to those of the aforementioned first embodiment.

Fifth Embodiment

A cross-point ferroelectric memory according to a fifth embodiment of the present invention reads data from ferroelectric capacitors on corresponding bit lines by previously setting the potentials of the bit lines linked with the ferroelectric capacitors to negative levels and thereafter applying a voltage pulse to the ferroelectric capacitors, dissimilarly to the cross-point ferroelectric memory according to the aforementioned fourth embodiment. Operations of the cross-point ferroelectric memory according to the fifth embodiment of the present invention are now described with reference to FIGS. 8 to 15, 18 and 20. The circuit structure of the cross-point ferroelectric memory according to the fifth embodiment is absolutely similar to that of the cross-point ferroelectric memory according to the aforementioned fourth embodiment.

Figure 20:
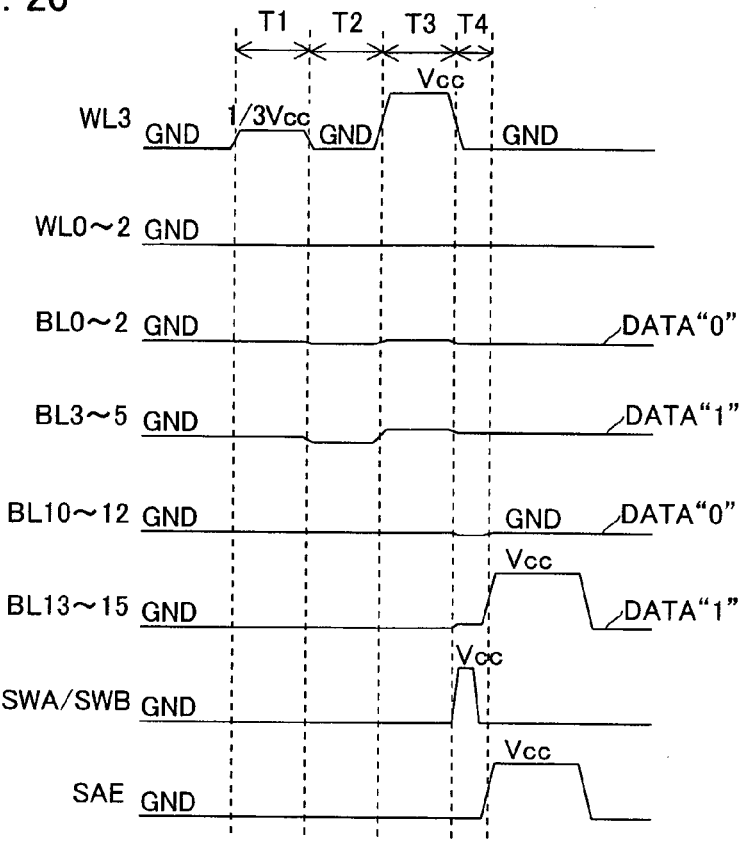
FIG. 20 is a voltage waveform diagram for illustrating operations of a cross-point ferroelectric memory according to a fifth embodiment of the present invention.

In an initial state of data reading in the cross-point ferroelectric memory according to the fifth embodiment, the potentials of word lines WL0 to WL3 and bit lines BL0 to BL5 and BL10 to BL15 are held at the GND level, as shown in FIG. 20. The potentials of control signals SWA and SWB and a sense amplifier activation signal SAE are also held at the GND level. In a period T1, the memory selects the word line WL3, which in turn rises from the GND level to a potential ⅓ Vcc. Thus, the voltage ⅓ Vcc is applied to all ferroelectric capacitors CF10 (see FIG. 18) linked with the word line WL3. At this time, the polarization states of the ferroelectric capacitors CF10 linked with the word line WL3 and the bit lines BL0 to BL2 shift from "0" to a point C, similarly to the case of the second embodiment shown in FIG. 8. In the ferroelectric capacitors CF10 linked with the word line WL3 and the bit lines BL3 to BL5, on the other hand, the polarization states shift from "1" to a point D, similarly to the case of the second embodiment shown in FIG. 12. At this time, the potentials of the bit lines BL0 to BL5 are fixed to the GND level. Thus, the potentials of the bit lines BL0 to BL5 remain intact at the GND level despite the change of the polarization states of the ferroelectric capacitors CF10. Thereafter the bit lines BL0 to BL5 enter floating states (high-impedance states).

In a period T2 shown in FIG. 20, the word line WL3 falls from the potential ⅓ Vcc to the GND level. Thus, a voltage of the GND level is applied to all ferroelectric capacitors CF10 linked with the word line WL3. At this time, the polarization states of the ferroelectric capacitors CF10 linked with the word line WL3 and the bit lines BL0 to BL2 shift from the point C to "0" along a hysteresis curve, similarly to the case of the second embodiment shown in FIG. 9. Thus, the total charge quantity of the bit lines BL0 to BL2 is reduced by a charge quantity $Q_{0downA}$ shown in FIG. 9. Therefore, the potentials of the bit lines BL0 to BL2 are reduced from the GND level in correspondence to the charge quantity $Q_{0down}$ to reach negative levels. In the ferroelectric capacitors CF10 linked with the word line WL3 and the bit lines BL3 to BL5, on the other hand, the polarization states shift from the point D to "1" along the hysteresis curve, similarly to the case of the second embodiment shown in FIG. 13. Thus, the total charge quantity of the bit lines BL3 to BL5 is reduced by a charge quantity $Q_{1down}$ shown in FIG. 13. Therefore, the potentials of the bit lines BL3 to BL5 are reduced from the GND level in correspondence to the charge quantity $Q_{1downA}$, to reach negative levels. According to the fifth embodiment, the cross-point ferroelectric memory sets the bit lines BL0 to BL5 to negative potentials in the period T2 shown in FIG. 20 in the aforementioned manner.

In a period T3 shown in FIG. 20, the cross-point ferroelectric memory selects the word line WL3 and applies a voltage pulse to all ferroelectric capacitors CF10 linked with the word line WL3 to step up the potentials thereof to the level Vcc. More specifically, the word line WL3 rises from the GND level to the potential Vcc. Thus, the voltage Vcc is applied to all ferroelectric capacitors CF10 linked with the word line WL3. At this time, the polarization states of the ferroelectric capacitors CF10 linked with the word line WL3 and the bit lines BL0 to BL2 shift from "0" to a point A along the hysteresis curve, similarly to the case of the second embodiment shown in FIG. 10. Thus, the total charge quantity of the bit lines BL0 to BL2 is increased by a charge quantity $Q_{0upB}$ shown in FIG. 10. Therefore, the potentials of the bit lines BL0 to BL2 are increased in correspondence to the charge quantity $Q_{0upB}$. In the ferroelectric capacitors CF10 linked with the word line WL3 and the bit lines BL3 to BL5, on the other hand, the polarization states shift from "1" to the point A along the hysteresis curve, similarly to the case of the second embodiment shown in FIG. 14. Thus, the total charge quantity of the bit lines BL3 to BL5 is increased by a charge quantity $Q_{1upB}$ shown in FIG. 14. Therefore, the potentials of the bit lines BL3 to BL5 are increased in correspondence to the charge quantity $Q_{1upB}$.

In a period T4 shown in FIG. 20, the word line WL3 falls from the potential Vcc to the GND level. Thus, a voltage of the GND level is applied to all ferroelectric capacitors CF10 linked with the word line WL3. At this time, the polarization states of the ferroelectric capacitors CF10 linked with the word line WL3 and the bit lines BL0 to BL2 shift from the point A to "0" along the hysteresis curve, similarly to the case of the second embodiment shown in FIG. 11. Thus, the total charge quantity of the bit lines BL0 to BL2 is reduced by a charge quantity $Q_{0downB}$ shown in FIG. 11. Therefore, the potentials of the bit lines BL0 to BL2 are reduced in correspondence to the charge quantity $Q_{0downB}$. Also in the ferroelectric capacitors CF10 linked with the word line WL0 and the bit lines BL3 to BL5, the polarization states shift from the point A to "0" along the hysteresis curve, similarly to the case of the second embodiment shown in FIG. 15. Thus, the total charge quantity of the bit lines BL3 to BL5 is reduced by a charge quantity $Q_{1downB}$ (=$Q_{0downB}$) shown in FIG. 15. Therefore, the potentials of the bit lines BL3 to BL5 are reduced in correspondence to the charge quantity $Q_{1downB}$.

The total charge quantity of the bit lines BL0 to BL2 is changed by a quantity ($-Q_{0down}+Q_{0upB}-Q_{0downB}$) in the periods T1 to T4 shown in FIG. 20. The charge quantity $Q_{0upB}$ is equal to the charge quantity $Q_{0downB}$ ($Q_{0upB}=Q_{0downB}$) as understood from the hysteresis curves shown in FIGS. 9 to 11, and hence the total charge quantity of the bit lines BL0 to BL2 is changed by a negative quantity in the periods T1 to T4 shown in FIG. 20. The bit lines BL0 to BL2, which have been at the GND level in the initial state, reach negative potentials in the period T4. On the other hand, the total charge quantity of the bit lines BL3 to BL5 is changed by a quantity ($-Q_{1downA}+Q_{1upB}-Q_{1downB}$) in the periods T1 to T4. The quantity ($-Q_{1down}+Q_{1upB}-Q_{1downB}$) is positive, as understood from the shapes of the hysteresis curves shown in FIGS. 13 to 15. Therefore, the total charge quantity of the bit lines BL3 to BL5 is changed by a positive quantity in the periods T1 to T4. The bit lines BL3 to BL5, which have been at the GND level in the initial state, reach positive potentials in the period T4.

The control signals SWA and SWB rise from the GND level to the potential Vcc. Thus, switching transistors 22 and 24 enter ON-states. Therefore, the potentials of the bit lines BL0 to BL5 are transmitted to the bit lines BL10 to BL15 through the ON-state switching transistors 22 respectively. Thus, the bit lines BL10 to BL12 reach negative potentials, while the bit lines BL13 to BL15 reach positive potentials. A reference potential $V_{ref}$ of the GND level is supplied to sense amplifiers 23 through the ON-state switching transistors 24. Thereafter the sense amplifiers 23 determine data read from the ferroelectric capacitors CF10 on the bit lines BL10 to BL15 as data "0" or "1" and amplify the same, similarly to the aforementioned fourth embodiment.

As hereinabove described, the cross-point ferroelectric memory according to the fifth embodiment, capable of easily generating negative potentials on the bit lines BL0 to BL2 linked with the ferroelectric capacitors CF10 holding data "0" while generating positive potentials of the bit lines BL3 to BL5 linked with the ferroelectric capacitors CF10 holding data "1" in data reading by previously setting the bit lines BL0 to BL5 linked with the ferroelectric capacitors CF10 to negative potentials and thereafter applying a voltage pulse to the ferroelectric capacitors CF10 for collectively reading data from the ferroelectric capacitors CF10 linked with the word line WL3, can easily generate negative potentials on the bit lines BL10 to BL12 linked with the bit lines BL0 to BL2 through the switching transistors and generate positive potentials on the bit lines BL13 to BL15 linked with the bit lines BL3 to BL5 through the switching transistors. Thus, the cross-point ferroelectric memory can set the reference potential $V_{ref}$ employed for determining the data read from the ferroelectric capacitors CF10 on the bit lines BL10 to BL15 as "0" or "1" to the GND level. Therefore, the cross-point ferroelectric memory can easily set the reference potential $V_{ref}$ also when the potentials generated on the bit lines BL10 to BL15 in data reading are dispersed. Further, the cross-point ferroelectric memory according to the fifth embodiment can easily generate negative potentials on the bit lines BL10 to BL12 linked with the ferroelectric capacitors CF10 holding the data "0" while generating positive potentials on the bit lines BL13 to BL15 linked with the ferroelectric capacitors CF10 holding the data "1" in data reading, so that the distribution range of the potentials (negative potentials) of the bit lines BL10 to BL12 reading the data "0" from the ferroelectric capacitors CF10 and that of the potentials (positive potentials) of the bit lines BL13 to BL15 reading the data "1" from the ferroelectric capacitors CF10 do not overlap with each other in data reading. Thus, the cross-point ferroelectric memory can correctly determine the data held in each ferroelectric capacitor CF10 as the data "0" or "1" by setting the reference potential $V_{ref}$ to the GND level (ground potential).

The remaining effects of the fifth embodiment are similar to those of the aforementioned first embodiment.

Sixth Embodiment

The structure of a cross-point ferroelectric memory according to a sixth embodiment of the present invention is now described with reference to FIG. 21.

Figure 21:
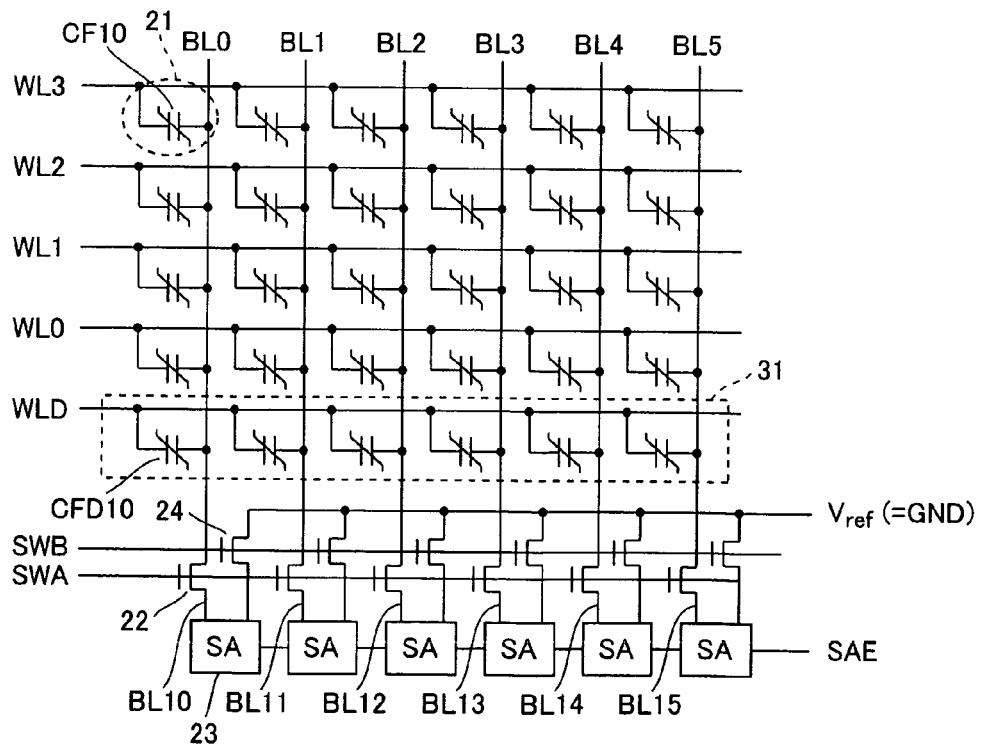
FIG. 21 is a circuit diagram showing the structure of a cross-point ferroelectric memory according to a sixth embodiment of the present invention.

As shown in FIG. 21, the cross-point ferroelectric memory according to the sixth embodiment comprises a dummy circuit 31 for setting bit lines BL0 to BL5 to negative potentials before the memory reads data from ferroelectric capacitors CF10 on the bit lines BL0 to BL5 by applying a voltage pulse to the ferroelectric capacitors CF10, dissimilarly to the cross-point ferroelectric memory according to the aforementioned fourth embodiment. This dummy circuit 31 is formed by dummy ferroelectric capacitors CFD10 provided for the respective ones of the bit lines BL0 to BL5. The dummy ferroelectric capacitors CFD10 are provided on positions of intersection between a dummy word line WLD arranged to extend perpendicularly to the bit lines BL0 to BL5 and the bit lines BL0 to BL5 respectively. The dummy word line WLD is an example of the "dummy driving line" in the present invention. First electrodes of the dummy ferroelectric capacitors CFD10 are connected to the dummy word line WLD, while second electrodes thereof are connected to the bit lines BL0 to BL5 respectively. The remaining structure of the cross-point ferroelectric memory according to the sixth embodiment is similar to that of the cross-point ferroelectric memory according to the aforementioned fourth embodiment.

Operations of the cross-point ferroelectric memory according to the sixth embodiment of the present invention are now described with reference to FIGS. 8, 9, 12, 13, 21 and 22. In the following description, it is assumed that the cross-point ferroelectric memory collectively reads data from all memory cells 21 linked with a word line WL3, while the dummy ferroelectric capacitors CFD10 linked with the bit lines BL0 to BL2 hold data "0" and the dummy ferroelectric capacitors CFD10 linked with the bit lines BL3 to BL5 hold data "1" respectively.

The cross-point ferroelectric memory according to the sixth embodiment sets the bit lines BL0 to BL5 to negative potentials through the dummy circuit 31 respectively before reading data from the ferroelectric capacitors CF10 (see FIG. 21) on the bit lines BL0 to BL5 by applying a voltage pulse to the ferroelectric capacitors CF10, dissimilarly to the cross-point ferroelectric memory according to the aforementioned fifth embodiment. More specifically, the dummy word line WLD rises from the GND level to a potential ⅓ Vcc in a period T1 (see FIG. 22) while the potentials of the bit lines BL0 to BL5 are fixed to the GND level. Thus, the voltage ⅓ Vcc is applied to the dummy ferroelectric capacitors CFD0 linked with the dummy word line WLD. At this time, the polarization states of the dummy ferroelectric capacitors CFD10 linked with the bit lines BL0 to BL2 shift from "0" to a point C, similarly to the case of the second embodiment shown in FIG. 8. In the dummy ferroelectric capacitors CFD10 linked with the bit lines BL3 to BL5, on the other hand, the polarization states shift from "1" to a point D, similarly to the case of the second embodiment shown in FIG. 12. Despite this change of the polarization states of the dummy ferroelectric capacitors CFD10, the potentials of the bit lines BL0 to BL5 linked with the dummy ferroelectric capacitors CFD10 are intactly fixed to the GND level. Thereafter the bit lines BL0 to BL5 enter floating states (high-impedance states).

Figure 22:
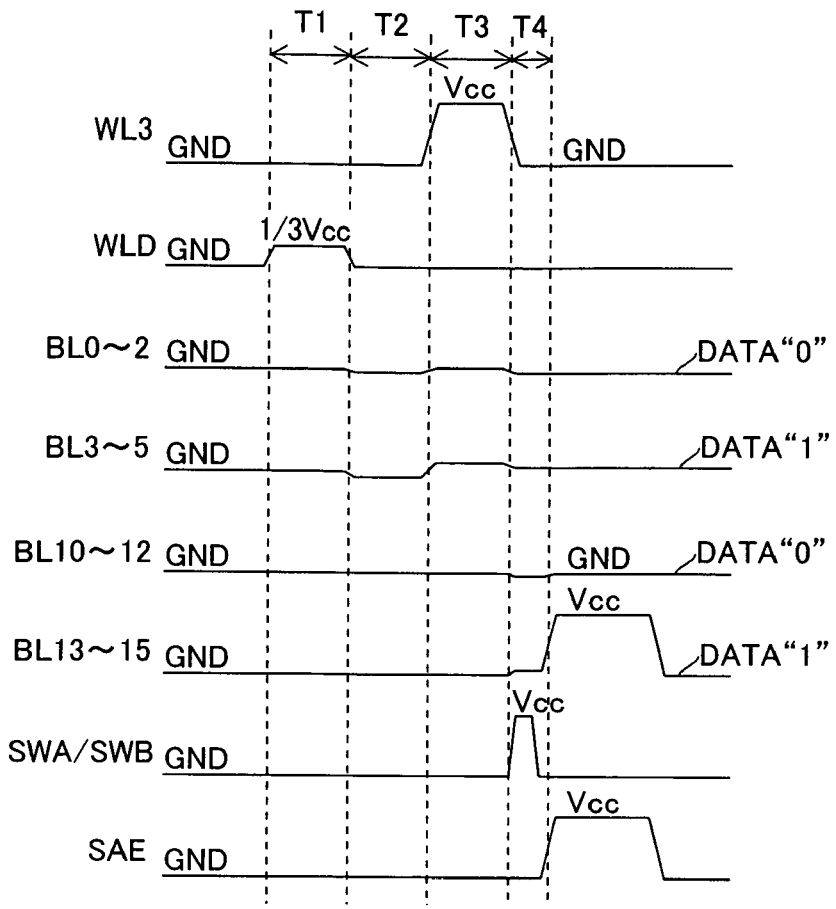
FIG. 22 is a voltage waveform diagram for illustrating operations of the cross-point ferroelectric memory according to the sixth embodiment of the present invention.
Figure 23:
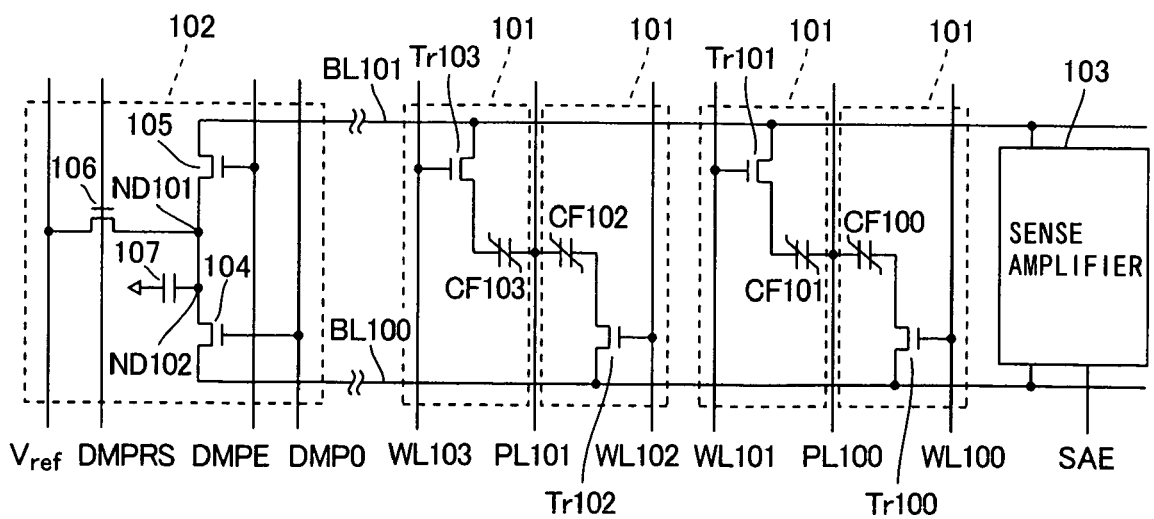
FIG. 23 is a circuit diagram showing the structure of an exemplary conventional 1T1C ferroelectric memory.
Figure 24:
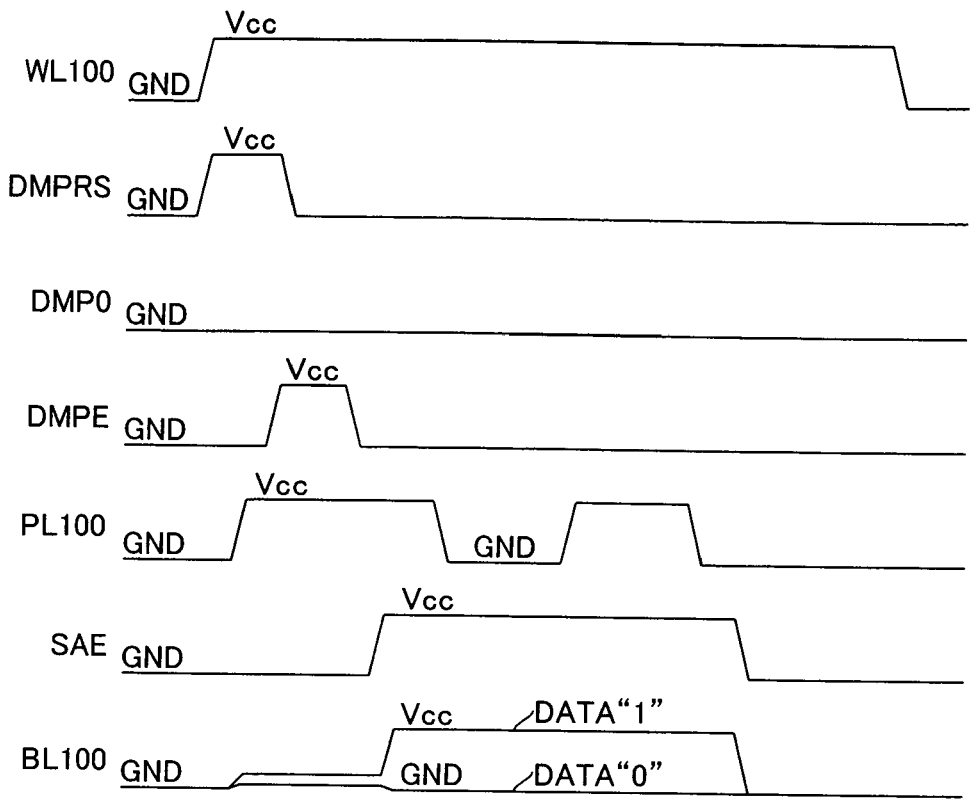
FIG. 24 is a voltage waveform diagram for illustrating operations of the exemplary conventional 1T1C ferroelectric memory.
Figure 25:
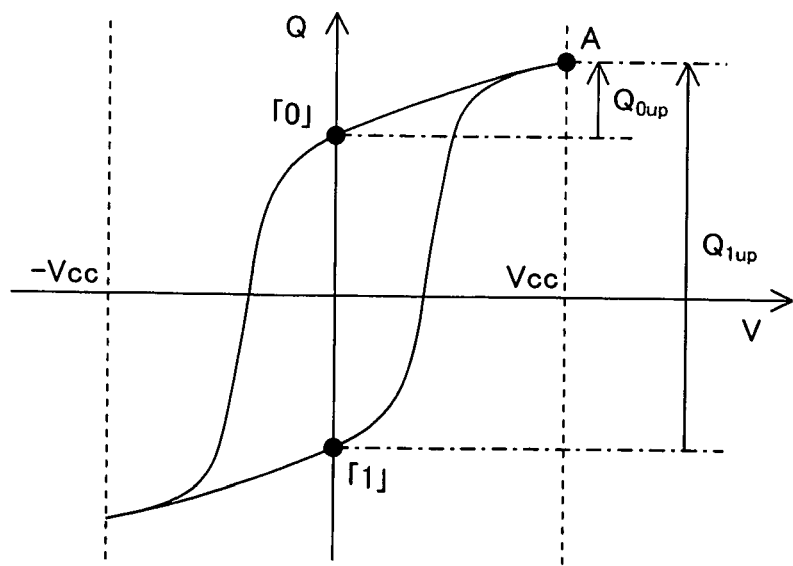
FIG. 25 is a hysteresis diagram showing a polarization state of a ferroelectric capacitor of the exemplary conventional 1T1C ferroelectric memory.
Figure 26:
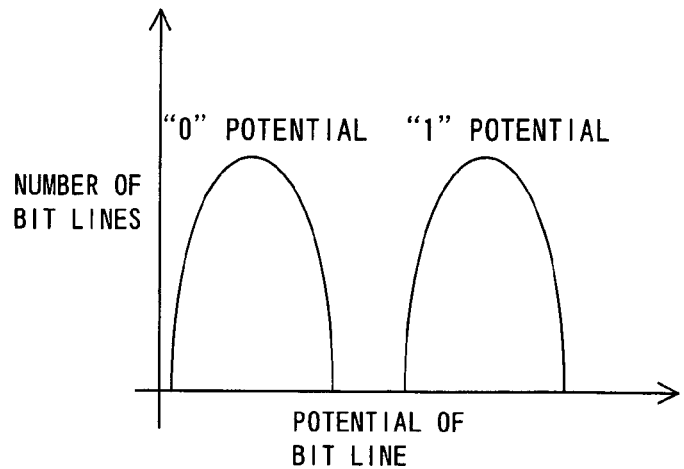
FIGS. 26 to 29 illustrate potential distributions on a bit line in data reading in the exemplary conventional 1T1C ferroelectric memory.
Figure 27:
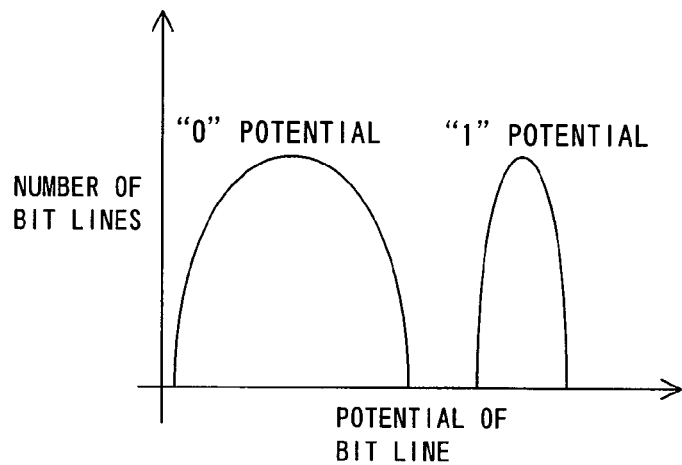
Figure 28:
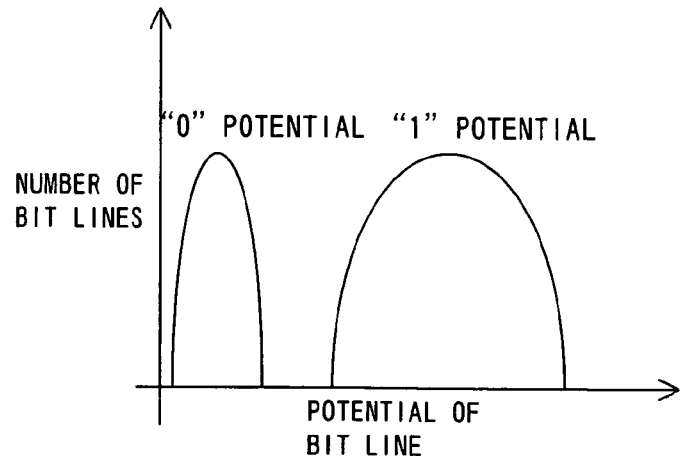
Figure 29:
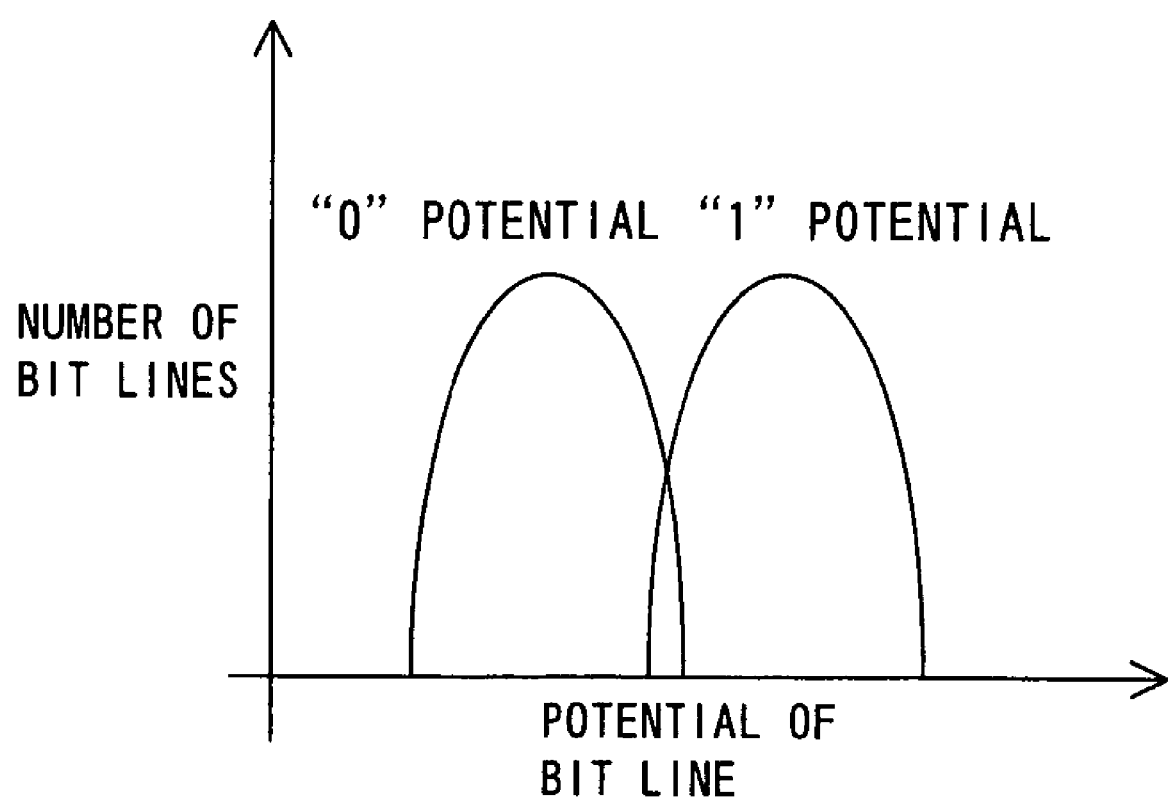

In a period T2 shown in FIG. 22, the dummy word line WLD falls from the potential ⅓ Vcc to the GND level. Thus, a voltage of the GND level is applied to all dummy ferroelectric capacitors CFD10 linked with the dummy word line WLD. At this time, the polarization states of the dummy ferroelectric capacitors CFD10 linked with the bit lines BL0 to BL2 shift from the point C to "0" along a hysteresis curve, similarly to the case of the second embodiment shown in FIG. 9. Thus, the total charge quantity of the bit lines BL0 to BL2 is reduced by a charge quantity $Q_{0downA}$ shown in FIG. 9. Therefore, the potentials of the bit lines BL0 to BL2 are reduced from the GND level in correspondence to the charge quantity $Q_{0downA}$, to reach negative levels. In the dummy ferroelectric capacitors CFD10 linked with the bit lines BL3 to BL5, on the other hand, the polarization states shift from a point D to "1" along the hysteresis curve, similarly to the case of the second embodiment shown in FIG. 13. Thus, the total charge quantity of the bit lines BL3 to BL5 is reduced by a charge quantity $Q_{1downA}$ shown in FIG. 13. Therefore, the potentials of the bit lines BL3 to BL5 are reduced from the GND level in correspondence to the charge quantity $Q_{1downA}$, to reach negative levels.

As hereinabove described, the cross-point ferroelectric memory according to the sixth embodiment sets the bit lines BL0 to BL5 to negative potentials in the period T2 shown in FIG. 22 through the dummy circuit 31. Therefore, the cross-point ferroelectric memory according to the sixth embodiment does not apply the voltage ⅓ Vcc to the ferroelectric capacitors CF10 of the memory cells 21 in order to set the bit lines BL0 to BL5 to negative potentials in the period T2 shown in FIG. 22. According to the sixth embodiment, the cross-point ferroelectric memory generates negative potentials on bit lines BL10 to BL12 linked with the ferroelectric capacitors CF10 holding data "0" while generating positive potentials on bit lines BL13 to BL15 linked with the ferroelectric capacitors CF10 holding data "1" after the period T2 shown in FIG. 22, similarly to the operation (see FIG. 20) of the cross-point ferroelectric memory according to the aforementioned fifth embodiment after the period T2. The remaining operations of the cross-point ferroelectric memory according to the sixth embodiment are similar to those of the cross-point ferroelectric memory according to the aforementioned fifth embodiment.

The cross-point memory according to the sixth embodiment can reduce the potentials of the bit lines BL0 to BL5 from the GND level to prescribed negative levels through the dummy word line WLD and the dummy ferroelectric capacitors CFD10 before applying a voltage pulse to the ferroelectric capacitors CF10 through the word line WL3 by setting the dummy word line WLD to the potential ⅓ Vcc while holding the potentials of the bit lines BL0 to BL5 at the GND level, thereafter bringing the bit lines BL0 to BL5 into floating states and thereafter reducing the potential of the dummy word line WLD from the level ⅓ Vcc to the GND level thereby setting the bit lines BL0 to BL5 to negative potentials before applying the voltage pulse to the ferroelectric capacitors CF10 through the word line WL3. Thus, the cross-point ferroelectric memory can reduce the potentials of the bit lines BL0 to BL5 from the GND level to prescribed negative levels without applying the voltage ⅓ Vcc to the ferroelectric capacitors CF10 holding data, dissimilarly to a case of reducing the potentials of the bit lines BL0 to BL5 from the GND level to the prescribed negative levels through the word line WL3 and the ferroelectric capacitors CF10. Therefore, the cross-point ferroelectric memory can set the bit lines BL0 to BL5 to negative potentials while inhibiting the ferroelectric capacitors CF10 holding data from disturbance resulting from the voltage ⅓ Vcc before reading data from the ferroelectric capacitors CF10 by applying a voltage pulse thereto in data reading.

The remaining effects of the sixth embodiment are similar to those of the aforementioned first embodiment.

Although the present invention has been described and illustrated in detail, it is clearly understood that the same is by way of illustration and example only and is not to be taken by way of limitation, the spirit and scope of the present invention being limited only by the terms of the appended claims.

For example, while the present invention is applied to a 1T1C or cross-point ferroelectric memory in each of the aforementioned embodiments, the present invention is not restricted to this but is also applicable to a ferroelectric memory other than 1T1C and cross-point ferroelectric memories.

While the ferroelectric memory according to each of the aforementioned second and fifth embodiments sets the bit line(s) to the negative potential(s) by applying the voltage ⅓ Vcc to the ferroelectric capacitor(s) before reading data from the ferroelectric capacitor(s) on the bit line(s), the present invention is not restricted to this but the ferroelectric capacitor may alternatively set the bit line(s) to the negative potential(s) by applying a voltage other than the voltage ⅓ Vcc to the ferroelectric capacitor(s). In this case, the ferroelectric memory preferably sets the bit line(s) to the negative potential(s) by applying a voltage of not more than ½ Vcc to the ferroelectric capacitor(s), in order to inhibit the ferroelectric capacitor(s) from large disturbance.

What is claimed is:

1. A memory comprising:
   a ferroelectric capacitor holding data; and
   a driving line and a data line linked with said ferroelectric capacitor,
   for applying a voltage pulse to said ferroelectric capacitor through said driving line when reading said data thereby generating a negative potential on said data line if said ferroelectric capacitor holds first data, or generating a positive potential on said data line if said ferroelectric capacitor holds second data.

2. The memory according to claim 1, determining said data held in said ferroelectric capacitor by comparing the potential of said data line and a reference potential of the ground level with each other when reading said data.

3. The memory according to claim 1, determining said data held in said ferroelectric capacitor after said voltage pulse applied to said ferroelectric capacitor falls.

4. The memory according to claim 1, reducing the total charge quantity of said data line to generate said negative potential on said data line if said ferroelectric capacitor holds said first data while increasing the total charge quantity of said data line to generate said positive potential on said data line if said ferroelectric capacitor holds said second data when reading said data.

5. The memory according to claim 4, wherein
the potential of said driving line is at the ground level before said voltage pulse is applied to said ferroelectric capacitor through said driving line, and the potential of said driving line is at a negative level after said voltage pulse is applied to said ferroelectric capacitor through said driving line.

6. The memory according to claim 1, setting said data line to said negative potential before applying said voltage pulse to said ferroelectric capacitor through said driving line for reading said data and holding said data line at said negative potential by leaving the total charge quantity of said data line intact before and after applying said voltage pulse to said ferroelectric capacitor if said ferroelectric capacitor holds said first data while generating said positive potential on said data line by increasing the total charge quantity of said data line if said ferroelectric capacitor holds said second data.

7. The memory according to claim 6, setting said driving line to a prescribed positive potential while holding said data line at the ground potential, thereafter bringing said data line into a floating state and thereafter reducing the potential of said driving line from said prescribed positive potential to the ground potential thereby setting said data line to said negative potential before applying said voltage pulse to said ferroelectric capacitor through said driving line.

8. The memory according to claim 6, further comprising:
a dummy driving line, and
a dummy ferroelectric capacitor linked with said dummy driving line and said data line,
for setting said dummy driving line to a prescribed positive potential while holding said data line at the ground potential, thereafter bringing said data line into a floating state and thereafter reducing the potential of said dummy driving line from said prescribed positive potential to the ground potential thereby setting said data line to said negative potential before applying said voltage pulse to said ferroelectric capacitor through said driving line.

9. A memory comprising:
a plurality of word lines and a plurality of bit lines arranged to intersect with each other; and
a memory cell, arranged on each of the intersections between said plurality of word lines and said plurality of bit lines, including a ferroelectric capacitor connected to corresponding said word line and corresponding said bit line for holding data,
for applying a voltage pulse to said ferroelectric capacitor through said corresponding word line when reading said data thereby generating a negative potential on said corresponding bit line if said ferroelectric capacitor holds first data, or generating a positive potential on said corresponding bit line if said ferroelectric capacitor holds second data.

10. The memory according to claim 9, determining said data held in said ferroelectric capacitor by comparing the potential of said corresponding bit line and a reference potential of the ground level with each other when reading said data.

11. The memory according to claim 9, determining said data held in said ferroelectric capacitor after said voltage pulse applied to said ferroelectric capacitor falls.

12. The memory according to claim 9, reducing the total charge quantity of said corresponding bit line to generate said negative potential on said corresponding bit line if said ferroelectric capacitor holds said first data while increasing the total charge quantity of said corresponding bit line to generate said positive potential on said corresponding bit line if said ferroelectric capacitor holds said second data when reading said data.

13. The memory according to claim 9, setting said corresponding bit line to said negative potential before applying said voltage pulse to said ferroelectric capacitor through said corresponding word line for reading said data, and
holding said corresponding bit line at said negative potential by leaving the total charge quantity of said corresponding bit line intact before and after applying said voltage pulse to said ferroelectric capacitor if said ferroelectric capacitor holds said first data while generating said positive potential on said corresponding bit line by increasing the total charge quantity of said corresponding bit line if said ferroelectric capacitor holds said second data.

14. The memory according to claim 13, further comprising:
a dummy word line, and
a dummy ferroelectric capacitor linked with said dummy word line and said corresponding bit line,
for setting said dummy word line to a prescribed positive potential while holding said corresponding bit line at the ground potential, thereafter bringing said corresponding bit line into a floating state and thereafter reducing the potential of said dummy word line from said prescribed positive potential to the ground potential thereby setting said corresponding bit line to said negative potential before applying said voltage pulse to said ferroelectric capacitor through said corresponding word line.

15. A memory comprising:
a plurality of bit lines;
a plurality of word lines and a plurality of driving lines arranged to intersect with said plurality of bit lines; and
a memory cell, arranged on each of the intersections between said plurality of word lines and said plurality of bit lines, including a transistor having either a source or a drain connected to corresponding said bit line and a gate connected to corresponding said word line and a ferroelectric capacitor connected to either said drain or said source of said transistor and corresponding said driving line for holding data,
for applying a voltage pulse to said ferroelectric capacitor through said corresponding driving line when reading said data thereby generating a negative potential on said corresponding bit line if said ferroelectric capacitor holds first data, or generating a positive potential on said corresponding bit line if said ferroelectric capacitor holds second data.

16. The memory according to claim 15, determining said data held in said ferroelectric capacitor by comparing the potential of said corresponding bit line and a reference potential of the ground level with each other when reading said data.

17. The memory according to claim 15, determining said data held in said ferroelectric capacitor after said voltage pulse applied to said ferroelectric capacitor falls.

18. The memory according to claim 15, reducing the total charge quantity of said corresponding bit line to generate said negative potential on said corresponding bit line if said ferroelectric capacitor holds said first data while increasing the total charge quantity of said corresponding bit line to generate said positive potential on said corresponding bit line if said ferroelectric capacitor holds said second data when reading said data.

19. The memory according to claim 15, setting said corresponding bit line to said negative potential before applying said voltage pulse to said ferroelectric capacitor through said corresponding driving line for reading said data, and holding said corresponding bit line at said negative potential by leaving the total charge quantity of said corresponding bit line intact before and after applying said voltage pulse to said ferroelectric capacitor if said ferroelectric capacitor holds said first data while generating said positive potential on said corresponding bit line by increasing the total charge quantity of said corresponding bit line if said ferroelectric capacitor holds said second data.

20. The memory according to claim 19, further comprising:

a dummy driving line, and a dummy ferroelectric capacitor linked with said dummy driving line and said corresponding bit line, for setting said dummy driving line to a prescribed positive potential while holding said corresponding bit line at the ground potential, thereafter bringing said corresponding bit line into a floating state and thereafter reducing the potential of said dummy driving line from said prescribed positive potential to the ground potential thereby setting said corresponding bit line to said negative potential before applying said voltage pulse to said ferroelectric capacitor through said corresponding driving line.

* * * * *